(12) United States Patent
Funahashi

(10) Patent No.: US 8,178,218 B2
(45) Date of Patent: *May 15, 2012

(54) MATERIAL FOR ORGANIC ELECTROLUMINESCENT DEVICE AND ORGANIC ELECTROLUMINESCENT DEVICE USING SAME

(75) Inventor: Masakazu Funahashi, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 100 days.

This patent is subject to a terminal disclaimer.

(21) Appl. No.: 12/318,859

(22) Filed: Jan. 9, 2009

(65) Prior Publication Data

US 2009/0195149 A1 Aug. 6, 2009

Related U.S. Application Data

(63) Continuation of application No. 10/532,794, filed as application No. PCT/JP03/13366 on Oct. 20, 2003, now abandoned.

(30) Foreign Application Priority Data

Nov. 12, 2002 (JP) .................................. 2002-327956

(51) Int. Cl.
*H01L 51/50* (2006.01)
*C07C 211/54* (2006.01)

(52) U.S. Cl. ........ 428/690; 428/917; 313/504; 313/506; 564/426

(58) Field of Classification Search .................... None
See application file for complete search history.

(56) References Cited

U.S. PATENT DOCUMENTS

| | | | |
|---|---|---|---|
| 5,081,569 A | 1/1992 | Quiogue et al. | |
| 5,153,072 A | 10/1992 | Ratner et al. | |
| 5,219,692 A | 6/1993 | Shimada et al. | |
| 5,536,949 A | 7/1996 | Hosokawa et al. | |
| 6,203,933 B1 | 3/2001 | Nakaya et al. | |
| 6,280,859 B1* | 8/2001 | Onikubo et al. | 428/690 |
| 6,743,948 B1 | 6/2004 | Hosokawa et al. | |
| 6,951,693 B2 | 10/2005 | Hosokawa et al. | |
| 7,425,653 B2* | 9/2008 | Funahashi | 564/434 |
| 7,524,568 B2* | 4/2009 | Funahashi | 428/690 |
| 7,642,380 B2* | 1/2010 | Funahashi | 564/308 |
| 7,651,786 B2* | 1/2010 | Matsuura et al. | 428/690 |
| 7,705,183 B2* | 4/2010 | Funahashi et al. | 564/308 |
| 7,737,628 B2* | 6/2010 | Funahashi | 313/504 |
| 7,816,017 B2* | 10/2010 | Funahashi et al. | 428/690 |
| 2002/0098379 A1* | 7/2002 | Arakane et al. | 428/690 |
| 2005/0064233 A1 | 3/2005 | Matsuura et al. | |
| 2011/0034733 A1* | 2/2011 | Funahashi et al. | 564/426 |

FOREIGN PATENT DOCUMENTS

| | | |
|---|---|---|
| EP | 10161112 | 12/1999 |
| JP | 06-240245 | 8/1994 |
| JP | 2001-131541 | 5/2001 |
| JP | 2003-142269 | 5/2003 |

\* cited by examiner

Primary Examiner — Dawn L. Garrett

(74) Attorney, Agent, or Firm — Oblon, Spivak, McClelland, Maier & Neustadt, L.L.P.

(57) ABSTRACT

The present invention provides an organic electroluminescent device material composed of an aromatic amine derivative having a specific structure in which amine moieties are linked to a chrysene moiety; and an organic electroluminescent device having a cathode, an anode, and one or more organic thin-film layers interposed between the cathode and the anode, the organic thin-layers including at least a light-emitting layer, wherein at least one of the organic thin-film layers contains the organic electroluminescent device material in the form of single component material or a mixture of a plurality of components. The organic electroluminescent device material and the organic electroluminescent device containing the material attains a long service life and can emit blue light of high color purity at high emission efficiency.

7 Claims, 11 Drawing Sheets

MATERIAL FOR ORGANIC ELECTROLUMINESCENT DEVICE AND ORGANIC ELECTROLUMINESCENT DEVICE USING SAME

This is a Continuation Application of Ser. No. 10/532,794, filed Apr. 25, 2005, which was a national stage of PCT/JP2003/013366, filed Oct. 20, 2003, which also claims priority to JP 2002-327956, filed Nov. 12, 2002.

TECHNICAL FIELD

The present invention relates to a material for use in an organic electroluminescent device (hereinafter may be referred to as "organic electroluminescent device material") which is employed as a flat light-emitting device for use in a wall-mounted, flat-panel television set or as a light source such as a backside light of a display device; which has a long service life; and which can emit blue light of high color purity at high emission efficiency. The invention also relates to an organic electroluminescent device including the material.

BACKGROUND ART

Electroluminescent (EL) devices including an organic substance have been promising candidates for wide-area, full-color, and inexpensive display devices based on solid-state emission, and development of a variety of such devices is under way. Generally, an EL device is composed of a pair of electrodes, and a light-emitting layer interposed between the electrodes. Light emission is a phenomenon occurring through the following mechanism. When an electric field is applied between electrodes, electrons are injected from the cathode and holes are injected from the anode, both to the light-emitting layer. In the light-emitting layer, the injected electrons are recombined with holes, thereby creating an excited state. During transition from the excited state to the ground state, energy is released as light.

As compared with inorganic light-emitting diodes, conventional organic EL devices are operated at higher operation voltage and exhibit lower emission luminance and emission efficiency. In addition, organic EL devices are not actually used in practice, because of considerable impairment in characteristics. Recently, organic EL devices have been improved step by step. However, further improvement in emission efficiency and service life is demanded.

One disclosed technique is based on employment of a single monoanthracene compound serving as an organic light-emitting material (Japanese Patent Application Laid-Open (kokai) No. 11-3782). However, this technique is not practically employed, since luminance at a current density of 165 mA/cm$^2$ is as low as 1,650 cd/m$^2$, and emission efficiency is as considerably low as 1 cd/A. Another disclosed technique is based on employment of a single bisanthracene compound serving as an organic light-emitting material (Japanese Patent Application Laid-Open (kokai) No. 8-12600). However, emission efficiency attained by the technique is as low as about 1 to 3 cd/A, which remains to be improved before the technique is put into practice. Meanwhile, a long-life organic EL device has been proposed (WO 94/06157). The EL device includes a distyryl compound serving as an organic light-emitting material in combination with an additive such as styrylamine. However, the proposed EL device has an insufficient half-life, which is to be further improved.

Still another disclosed technique is based on employment of an organic light-emitting medium layer containing a mono- or a bis-anthracene compound and a distyryl compound (Japanese Patent Application Laid-Open (kokai) No. 2001-284050). According to the technique, a peak in an emission spectrum is red-shifted because of a conjugation structure of the styryl compound, thereby impairing color purity.

DISCLOSURE OF THE INVENTION

The present invention has been conceived in order to solve the aforementioned problems. Thus, an object of the present invention is to provide a material for use in an organic EL device material which has a long service life and which can emit blue light of high color purity at high emission efficiency. Another object of the invention is to provide an organic EL device including the material.

The present inventors have carried out extensive studies with an aim toward developing a material for use in an organic EL device exhibiting the aforementioned desirable properties and an organic EL device including the material, and have found that the aforementioned objects can be attained through employment of an aromatic amine derivative in which amine moieties are linked to a chrysene moiety and which is represented by any of the following formulas (I) to (IV). The present invention has been accomplished on the basis of this finding.

Accordingly, the present invention provides an organic EL device material comprising an aromatic amine derivative represented by any of the following formulas (I) to (IV):

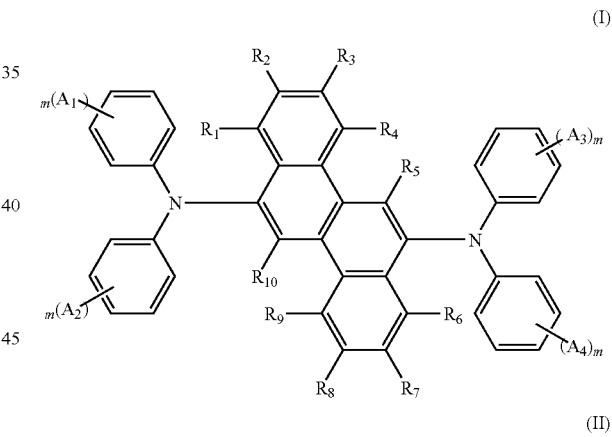

(I)

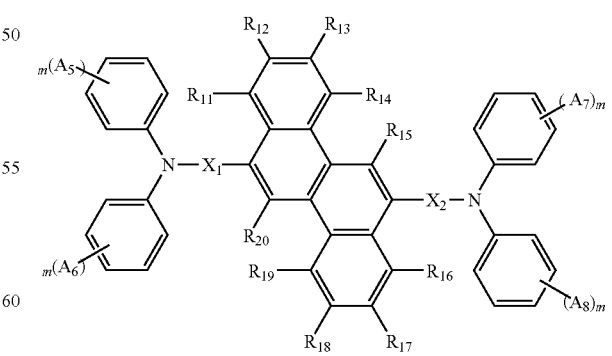

(II)

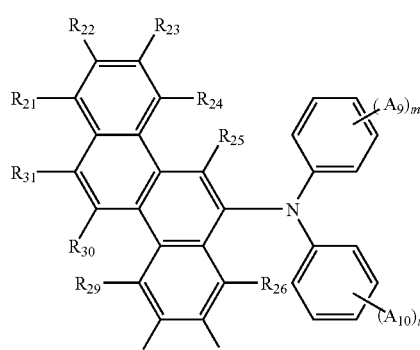

(III)

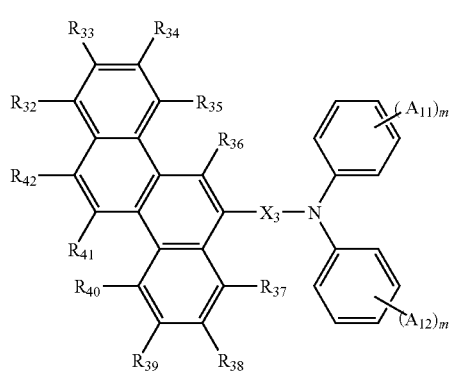

(IV)

(wherein each of $A_1$ to $A_{12}$ represents a hydrogen atom, a substituted or unsubstituted alkyl group having 1 to 50 carbon atoms, a substituted or unsubstituted aryl group having 5 to 50 ring carbon atoms, a substituted or unsubstituted cycloalkyl group having 3 to 50 ring carbon atoms, a substituted or unsubstituted alkoxyl group having 1 to 50 carbon atoms, a substituted or unsubstituted aryloxy group having 5 to 50 ring carbon atoms, a substituted or unsubstituted arylamino group having 5 to 50 ring carbon atoms, a substituted or unsubstituted alkylamino group having 1 to 20 carbon atoms, or a halogen atom; m is an integer of 0 to 5, and when m is 2 or more, groups represented by any of $A_1$ to $A_{12}$ may be identical to or different from one another, or may be linked together to form a saturated or unsaturated ring; each pair of $A_1$ and $A_2$, $A_3$ and $A_4$, $A_5$ and $A_6$, $A_7$ and $A_8$, $A_9$ and $A_{10}$ and $A_{11}$ and $A_{12}$ is such that the members thereof may be linked together to form a saturated or unsaturated ring;

with the proviso that in formula (I), at least one of $A_1$ to $A_4$ does not represent a hydrogen atom, that in formula (II), at least one of $A_5$ to $A_8$ does not represent a hydrogen atom, that in formula (III), at least one of $A_9$ and $A_{10}$ does not represent a hydrogen atom, and that in formula (IV), at least one of $A_{11}$ and $A_{12}$ does not represent a hydrogen atom;

each of $R_1$ to $R_{42}$ represents a hydrogen atom, a substituted or unsubstituted alkyl group having 1 to 20 carbon atoms, a substituted or unsubstituted aryl group having 6 to 20 ring carbon atoms, or a cyano group; and each of $X_1$ to $X_3$ represents a substituted or unsubstituted arylene group having 6 to 20 ring carbon atoms).

The present invention also provides an organic EL device comprising a cathode, an anode, and one or more organic thin-film layers interposed between the cathode and the anode, the organic thin-layers including at least a light-emitting layer, wherein at least one of the organic thin-film layers contains the organic EL device material in the form of single component material or a mixture of a plurality of components. The present invention also provides such an organic EL device, wherein the light-emitting layer contains the organic EL device material in an amount of 0.1 to 20 wt. %.

BEST MODES FOR CARRYING OUT THE INVENTION

Figure 1:
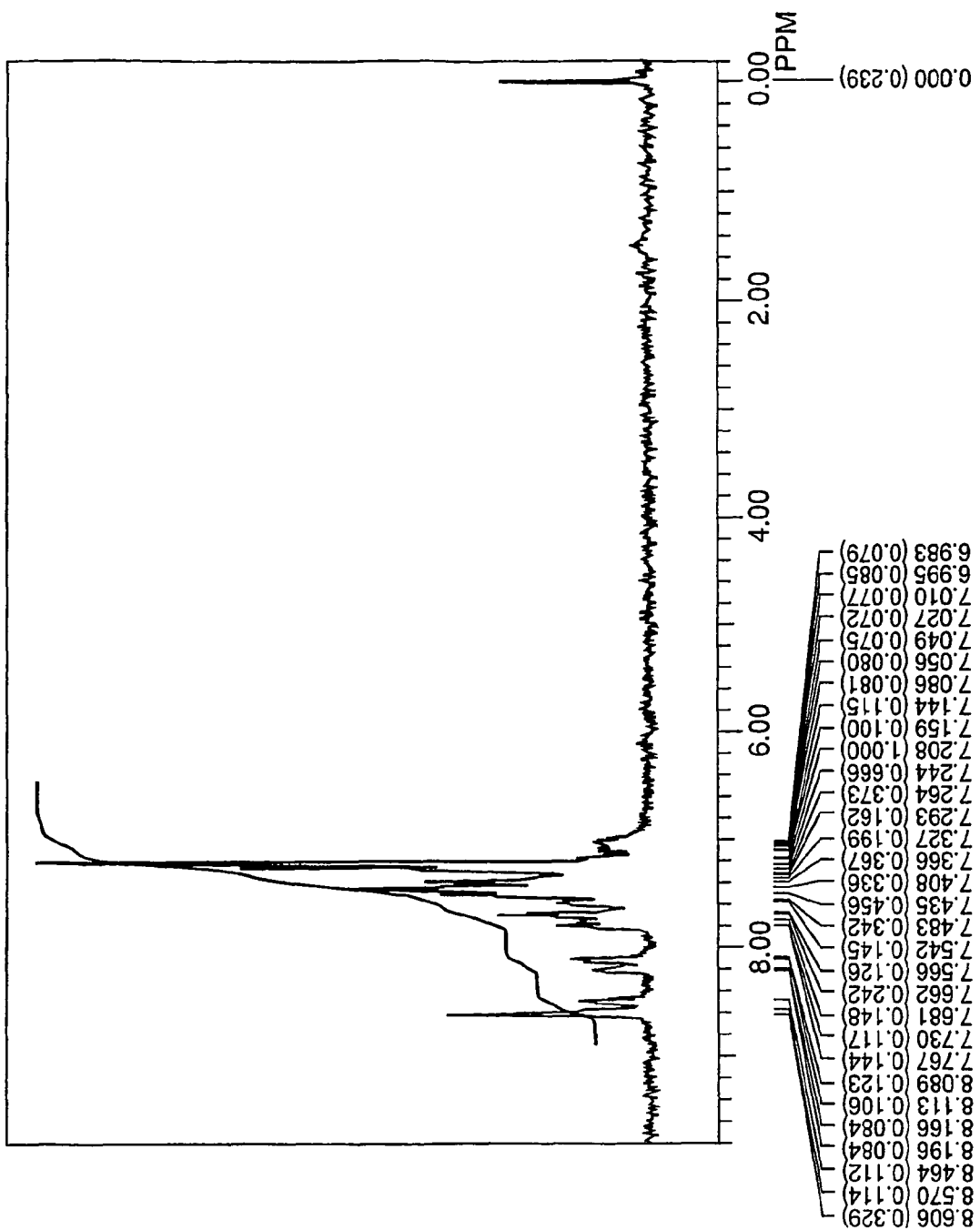
FIG. 1 is an NMR spectrum of compound (1) synthesized in Synthesis Example 1 and serving an organic EL device material according to the present invention.

The organic EL device material of the present invention comprises an aromatic amine derivative represented by any of the aforementioned formulas (I) to (IV).

In formulas (I) to (IV), each of $A_1$ to $A_{12}$ represents a hydrogen atom, a substituted or unsubstituted alkyl group having 1 to 50 (preferably 1 to 20) carbon atoms, a substituted or unsubstituted aryl group having 5 to 50 (preferably 5 to 20) ring carbon atoms, a substituted or unsubstituted cycloalkyl group having 3 to 50 (preferably 5 to 12) ring carbon atoms, a substituted or unsubstituted alkoxyl group having 1 to 50 (preferably 1 to 6) carbon atoms, a substituted or unsubstituted aryloxy group having 5 to 50 (preferably 5 to 18) ring carbon atoms, a substituted or unsubstituted arylamino group having 5 to 50 (preferably 5 to 18) ring carbon atoms, a substituted or unsubstituted alkylamino group having 1 to 20 carbon atoms (preferably 1 to 6), or a halogen atom.

Examples of the substituted or unsubstituted alkyl group represented by any of $A_1$ to $A_{12}$ include methyl, ethyl, propyl, isopropyl, butyl, sec-butyl, tert-butyl, pentyl, hexyl, heptyl, octyl, stearyl, 2-phenylisopropyl, trichloromethyl, trifluoromethyl, benzyl, α-phenoxybenzyl, α,α-dimethylbenzyl, α,α-methylphenylbenzyl, α,α-ditrifluoromethylbenzyl, triphenylmethyl, and α-benzyloxybenzyl.

Examples of the substituted or unsubstituted aryl group represented by any of $A_1$ to $A_{12}$ include phenyl, 2-methylphenyl, 3-methylphenyl, 4-methylphenyl, 4-ethylphenyl, biphenyl, 4-methylbiphenyl, 4-ethylbiphenyl, 4-cyclohexylbiphenyl, terphenyl, 3,5-dichlorophenyl, naphthyl, 5-methylnaphthyl, anthryl, and pyrenyl.

Examples of the substituted or unsubstituted cycloalkyl group represented by any of $A_1$ to $A_{12}$ include cyclopropyl, cyclobutyl, cyclopentyl, and cyclohexyl.

Examples of the substituted or unsubstituted alkoxyl group represented by any of $A_1$ to $A_{12}$ include methoxy, ethoxy, propoxy, isopropoxy, butoxy, isobutoxy, sec-butoxy, tert-butoxy, pentyloxy groups, and hexyloxy groups.

Examples of the substituted or unsubstituted aryloxy group represented by any of $A_1$ to $A_{12}$ include phenoxy, tolyloxy, and naphthyloxy.

Examples of the substituted or unsubstituted arylamino group represented by any of $A_1$ to $A_{12}$ include diphenylamino, ditolylamino, dinaphthylamino, and naphthylphenylamino.

Examples of the substituted or unsubstituted alkylamino group represented by any of $A_1$ to $A_{12}$ include dimethylamino, diethylamino, and dihexylamino.

Examples of the halogen atom represented by any of $A_1$ to $A_{12}$ include fluorine, chlorine, and bromine.

In formula (I), at least one of $A_1$ to $A_4$ does not represent a hydrogen atom. In formula (II), at least one of $A_5$ to $A_8$ does not represent a hydrogen atom. In formula (III), at least one of $A_9$ and $A_{10}$ does not represent a hydrogen atom. In formula (IV), at least one of $A_{11}$ and $A_{12}$ does not represent a hydrogen atom.

The "m" is an integer of 0 to 5, preferably 0 to 2. When m is 2 or more, groups represented by any of $A_1$ to $A_{12}$ may be identical to or different from one another, or may be linked together to form a saturated or unsaturated ring. Each pair of $A_1$ and $A_2$, $A_3$ and $A_4$, $A_5$ and $A_6$, $A_7$ and $A_8$, $A_9$ and $A_{10}$, and $A_{11}$ and $A_{12}$, is such that the members thereof may be linked together to form a saturated or unsaturated ring.

Each of $R_1$ to $R_{42}$ represents a hydrogen atom, a substituted or unsubstituted alkyl group having 1 to 20 ring carbon atoms, a substituted or unsubstituted aryl group having 6 to 20 ring carbon atoms, or a cyano group.

Examples of the substituted or unsubstituted alkyl group and aryl group represented by any of $R_1$ to $R_{42}$ include the same groups as mentioned in relation to the $A_1$ to $A_{12}$.

Each of $X_1$ to $X_3$ represents a substituted or unsubstituted arylene group having 6 to 20 ring carbon atoms.

Examples of the substituted or unsubstituted arylene group represented by any of $X_1$ to $X_3$ include phenyl, biphenyl, terphenyl, divalent groups derived from naphthalene, fluorene, or a similar compound, and divalent groups formed by linking a plurality of the compounds.

Specific examples of the aromatic amine derivative represented by any of formulas (I) to (IV) include, but are not limited to, the following. The symbol "Me" denotes a methyl group.

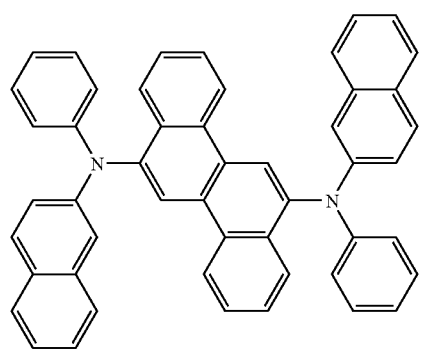

(1)

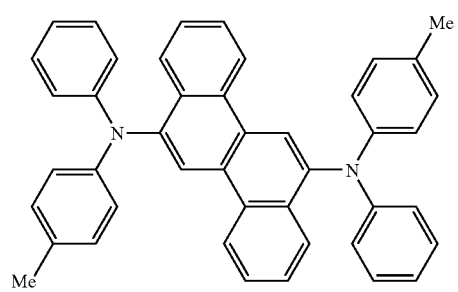

(2)

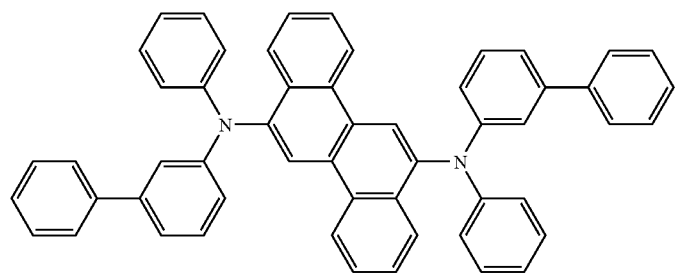

(3)

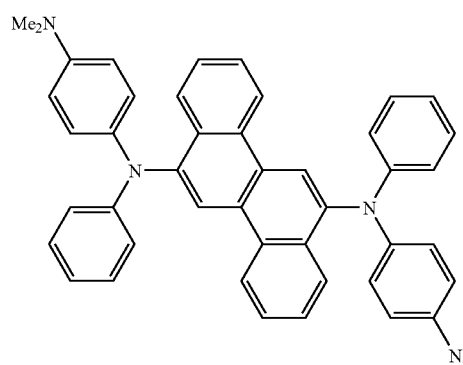

(4)

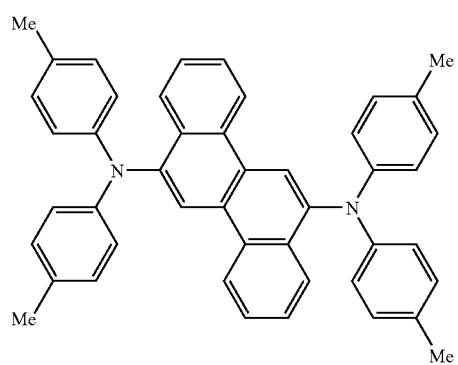

(5)

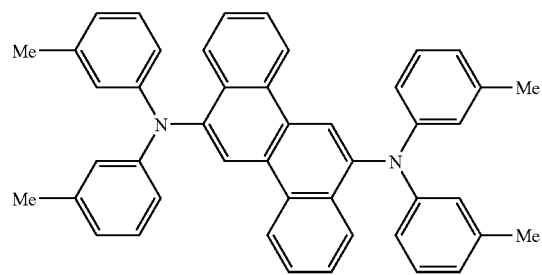
(6)
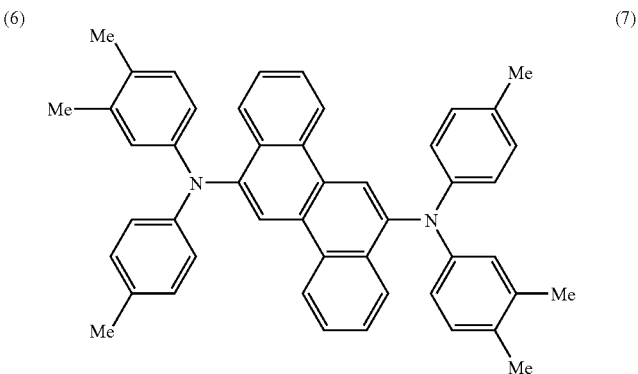
(7)
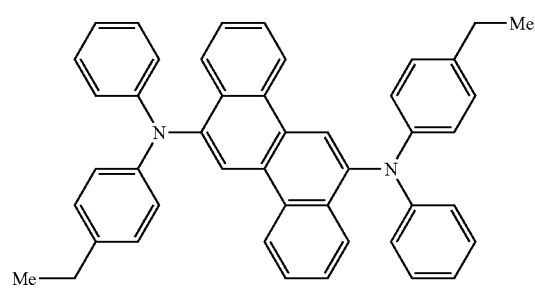
(8)
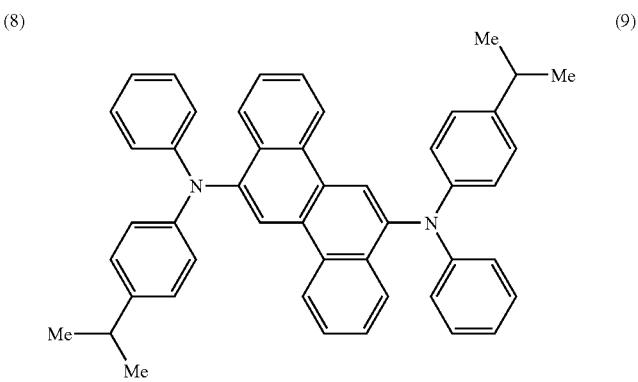
(9)
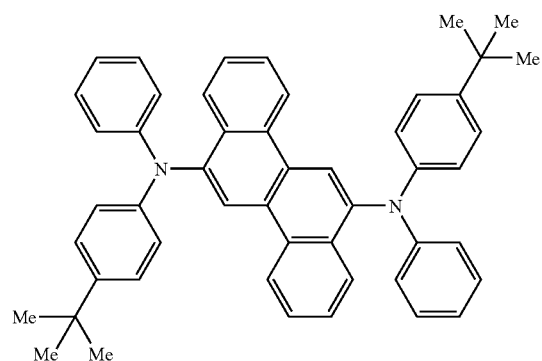
(10)
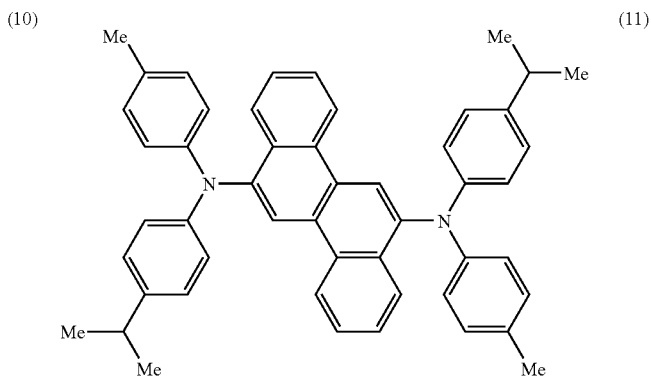
(11)
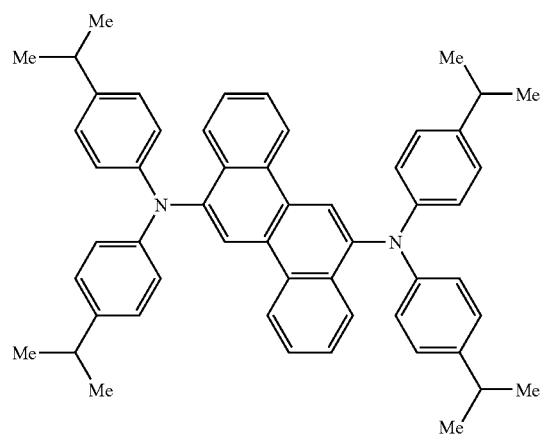
(12)
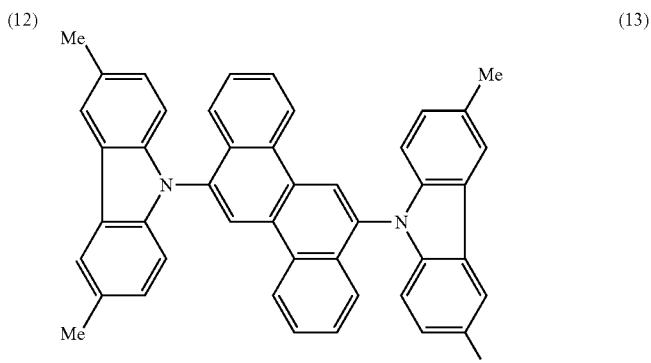
(13)

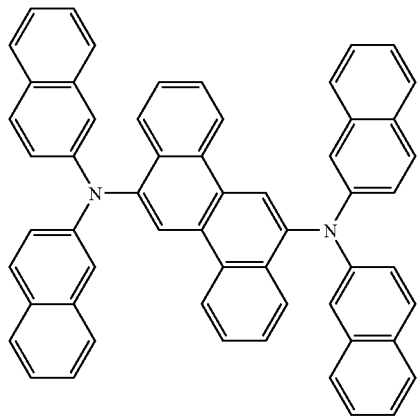
(14)
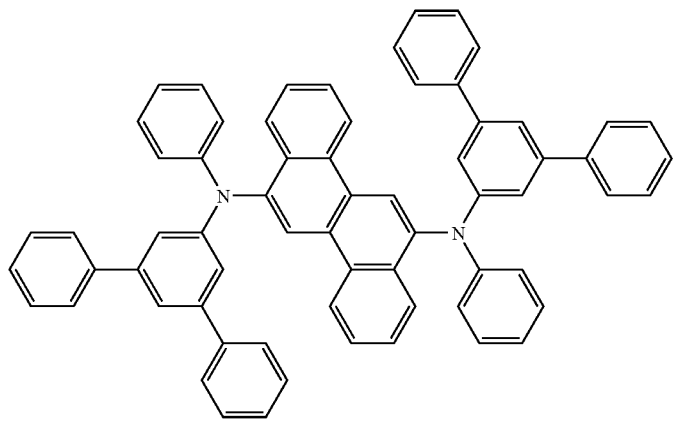
(15)
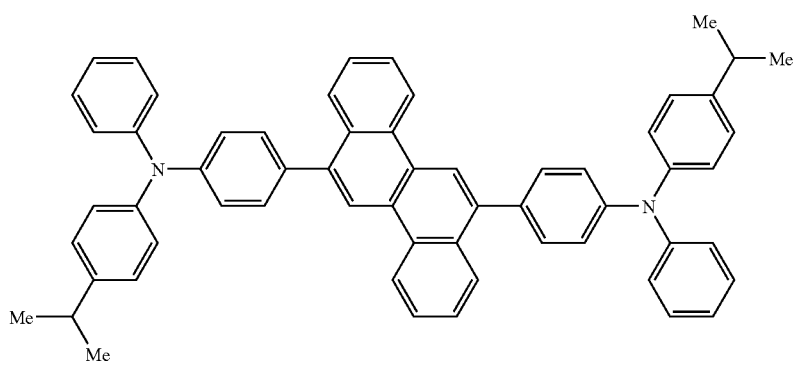
(16)
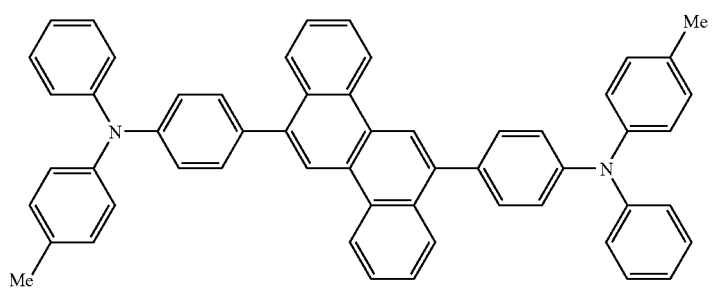
(17)

-continued
(18)
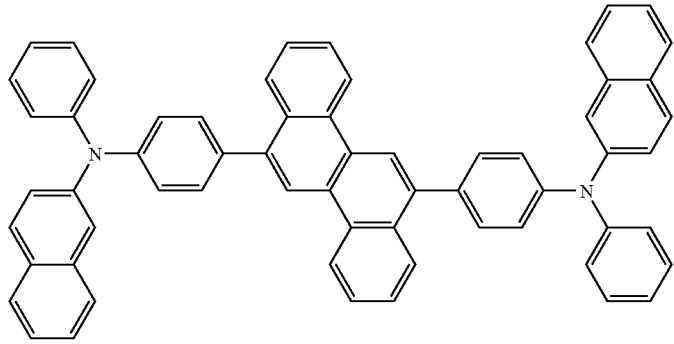
(19)
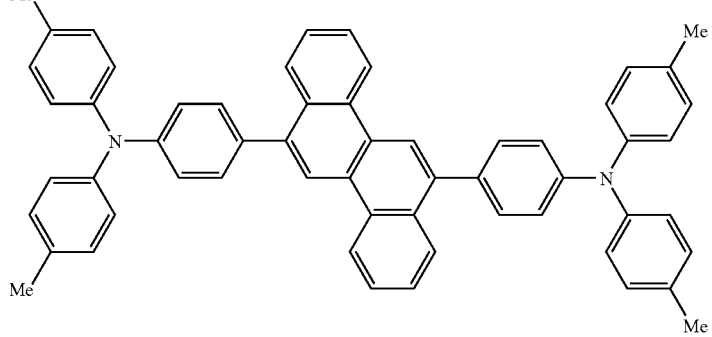
(20)
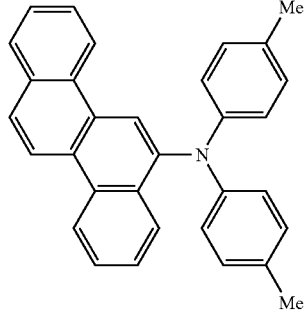
(21)
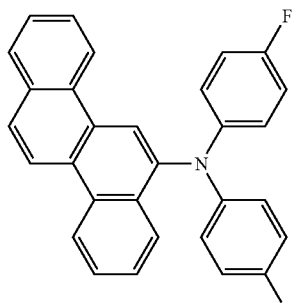
(22)
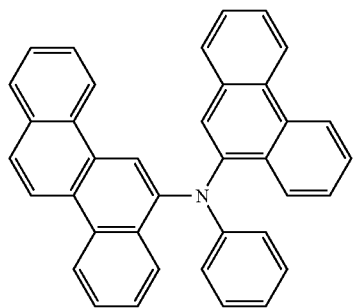
(23)
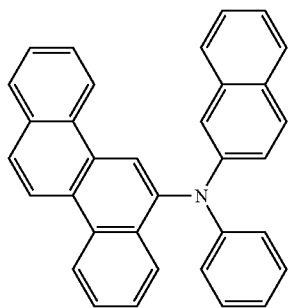
(24)
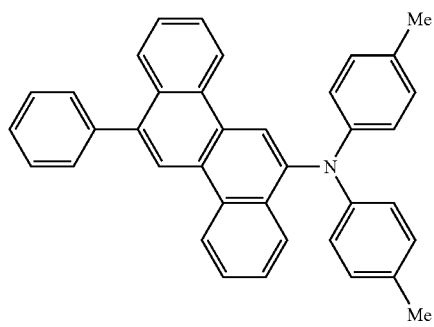

(25)

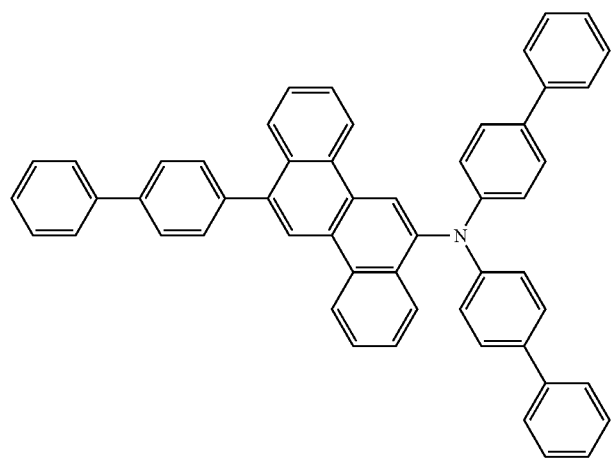

(26)

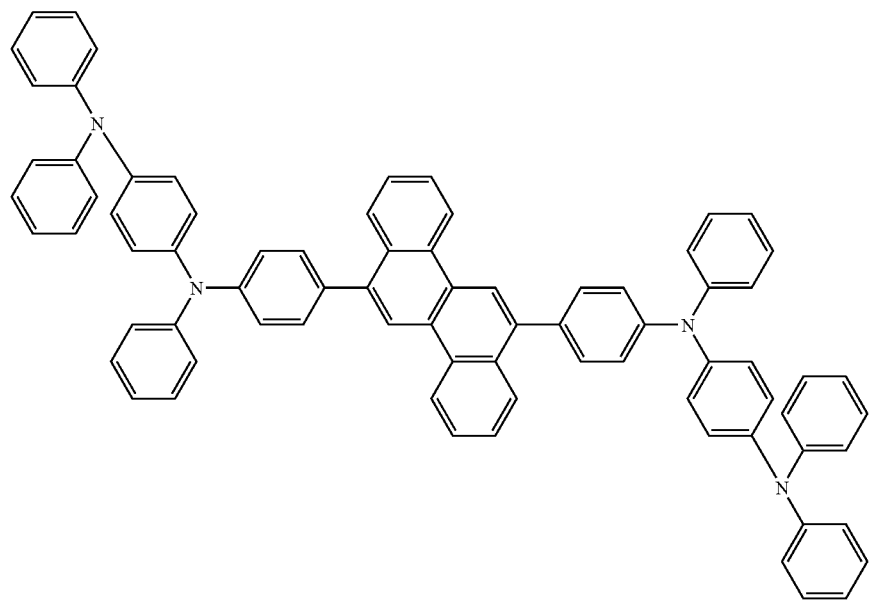

The compound of the present invention represented by any of the formulas (I) to (IV) has a structure in which amine moieties substituted by a substituent-containing benzene ring are linked to a chrysene moiety. Therefore, association of molecules of the compound is prevented, thereby prolonging the life time. The compound of the present invention exhibits highly fluorescent properties in the solid state and excellent electric-field-induced emission characteristics, and attains a fluorescence quantum efficiency of 0.3 or more. In addition, the compound exhibits excellent hole-injectability and hole-transportability from a metallic electrode or an organic thin-film layer, as well as excellent electron-injectability and electron-transportability from a metallic electrode or an organic thin-film layer. Thus, the compound of the present invention is effectively used as an organic EL device material. The compound may be used in combination with another hole-transporting material, another electron-transporting material, or a doping material.

The organic EL device of the present invention is composed of a cathode, an anode, and one or more organic thin films interposed between the cathode and the anode. When a single organic thin film is used, a light-emitting layer is interposed between the cathode and the anode. The light-emitting layer contains a light-emitting material and may further contain a hole-injecting material for transporting, to the light-emitting material, holes injected from the anode, or an electron-injecting material for transporting, to the light-emitting material, electrons injected from the cathode. By virtue of excellent emission characteristics, hole-injectability, hole-transportability, electron-injectability, and electron-transportability, the compound represented by any of formulas (I) to (IV) can be used as a light-emitting material in the light-emitting layer.

In the organic EL device of the present invention, the light-emitting layer preferably contains the organic EL device material in an amount of 0.1 to 20 wt. %, more preferably 1 to 10 wt. %. Since the organic EL device material exhibits remarkably high fluorescence quantum efficiency and high hole- and electron-transportability and can provide uniform thin film, the light-emitting layer can be formed solely from the light-emitting material of the present invention.

Examples of the multi-layer structure of the organic EL device include (anode/hole-injecting layer/light-emitting layer/cathode), (anode/light-emitting layer/electron-injecting layer/cathode), and (anode/hole-injecting layer/light-emitting layer/electron-injecting layer/cathode).

In addition to the compound of the present invention represented by any of formulas (I) to (IV), the light-emitting layer may further contain, in accordance with needs, a known light-emitting material, doping material, hole-injecting material, or electron-injecting material. When the organic EL device has a multi-layer structure, decrease in luminance and life time due to quenching can be prevented. If required, a light-emitting material can be used in combination with a doping material, a hole-injecting material, or an electron-injecting material. When a doping material is used, emission luminance and emission efficiency can be elevated, and red-light-emission or blue-light-emission can be attained. Each of the hole-injecting layer, light-emitting layer, and electron-injecting layer may be composed of two or more layers. In the case of the hole-injecting layer, a layer to which holes are injected from an electrode is referred to as "hole-injecting layer," and a layer for receiving holes from the hole-injecting layer and transporting the holes to the light-emitting layer is referred to as "hole-transporting layer." Similarly, in the case of the electron-injecting layer, a layer to which electrons are injected from an electrode is referred to as "electron-injecting layer," and a layer for receiving electrons from the electron-injecting layer and transporting the electrons to the light-emitting layer is referred to as "electron-transporting layer." These layers may be employed in accordance with energy level of the material, heat resistance, adhesion with respect to an organic layer or a metallic electrode, or other factors.

No particular limitation is imposed on the light-emitting material or the doping material which may be used in the light-emitting layer in combination with the compound represented by any of formulas (I) to (IV). Examples include anthracene, naphthalene, phenanthrene, pyrene, tetracene, coronene, chrysene, fluoresceine, perylene, phthaloperylene, naphthaloperylene, perynone, phthaloperynone, naphthaloperynone, diphenylbutadiene, tetraphenylbutadiene, coumarin, oxadiazole, aldazine, bisbenzoxazoline, bisstyryl, pyrazine, cyclopentadiene, quinoline metal complexes, aminoquinoline metal complexes, benzoquinoline metal complexes, imines, diphenylethylene, vinylanthracene, diaminocarbazole, pyrane, thiopyrane, polymethine, merocyanine, imidazole-chelated oxinoid compounds, quinacridone, rubrene, and fluorescent dyes.

Preferably, the hole-injecting material is a compound which can transfer holes, which exhibits hole-injecting effect (from an anode) and excellent hole-injecting effect to a light-emitting layer or a light-emitting material, which prevents transfer of excitons generated in the light-emitting layer to an electron-injecting layer or an electron-injecting material, and which has excellent thin-film-formability. No particular limitation is imposed on the hole-injecting material, and specific examples include phthalocyanine derivatives, naphthalocyanine derivatives, porphyrin derivatives, oxazole, oxadiazole, triazole, imidazole, imidazolone, imidazolethione, pyrazoline, pyrazolone, tetrahydroimidazole, oxazole, oxadiazole, hydrazone, acylhydrazone, polyarylalkanes, stilbene, butadiene, benzidine-type triphenylamines, styrylamine-type triphenylamines, diamine-type triphenylamines, derivatives thereof, and polymer materials such as polyvinylcarbazole, polysilane, and conductive polymers.

Among the hole-injecting materials which may be used in the organic EL device of the present invention, an aromatic tertiary amine derivative and a phthalocyanine derivative serve as a more effective hole-injecting material.

No particular limitation is imposed on the type of the aromatic tertiary amine derivative, and examples include triphenylamine, tritolylamine, tolyldiphenylamine, N,N'-diphenyl-N,N'-(3-methylphenyl)-1,1'-biphenyl-4,4'-diamine, N,N,N',N'-(4-methylphenyl)-1,1'-phenyl-4,4'-diamine, N,N,N',N'-(4-methylphenyl)-1,1'-biphenyl-4,4'-diamine, N,N'-diphenyl-N,N'-dinaphthyl-1,1'-biphenyl-4,4'-diamine, N,N'-(methylphenyl)-N,N'-(4-n-butylphenyl)-phenanthrene-9,10-diamine, N,N-bis(4-di-4-tolylaminophenyl)-4-phenyl-cyclohexane, and oligomers and polymers having a skeletal structure of any of these aromatic tertiary amines.

No particular limitation is imposed on the type of the phthalocyanine (Pc) derivative, and examples include phthalocyanine derivatives such as $H_2Pc$, CuPc, CoPc, NiPc, ZnPc, PdPc, FePc, MnPc, ClAlPc, ClGaPc, ClInPc, ClSnPc, $Cl_2SiPc$, (HO)AlPc, (HO)GaPc, VOPc, TiOPc, MoOPc, GaPc-O-GaPc, and naphthalocyanine derivatives.

The organic EL device of the present invention preferably includes, between the light-emitting layer and the anode, a layer containing any of these aromatic tertiary amine derivatives and/or phthalocyanine derivatives, for example, the aforementioned hole-transporting layer or a hole-injecting layer.

Preferably, the electron-injecting material is a compound which can transfer electrons, which exhibits electron-injecting effect (from a cathode) and excellent electron-injecting effect to a light-emitting layer or a light-emitting material, which prevents transfer of excitons generated in the light-emitting layer to a hole-injecting layer, and which has excellent thin-film-formability. No particular limitation is imposed on the electron-injecting material, and specific examples include fluorenone, anthraquinodimethane, diphenoquinone, thiopyrane dioxide, oxazole, oxadiazole, triazole, imidazole, perylenetetracarboxylic acid, fluorenylidenemethane, anthraquinodimethane, anthrone, and derivatives thereof. The hole-injecting material may be sensitized through addition of an electron-acceptor thereto, and the electron-injecting material may be sensitized through addition of an electron-donor thereto.

Among the electron-injecting materials which may be used in the organic EL device of the present invention, a metal complex compound and a nitrogen-containing five-membered ring derivative serve as a more effective electron-injecting material.

No particular limitation is imposed on the type of the metal complex compound, and examples include 8-hydroxyquinolinatolithium, bis(8-hydroxyquinolinato)zinc, bis(8-hydroxyquinolinato)copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo [h]quinolinato)beryllium, bis (10-hydroxybenzo [h]quinolinato)zinc, bis(2-methyl-8-quinolinato) chlorogallium, bis(2-methyl-8-quinolinato)(o-cresolato) gallium, bis(2-methyl-8-quinolinato)(1-naphtholato) aluminum, and bis(2-methyl-8-quinolinato)(2-naphtholato) gallium.

The nitrogen-containing five-membered-ring derivative is preferably an oxazole derivative, a thiazole derivative, an oxadiazole derivative, a thiadiazole derivative, and a triazole derivative. Specific examples of the derivative include 2,5-bis (1-phenyl)-1,3,4-oxazole, dimethyl-POPOP, 2,5-bis (1-phenyl)-1,3,4-thiazole, 2,5-bis(1-phenyl)-1,3,4-oxadiazole, 2-(4'-tert-butylphenyl)-5-(4"-biphenyl)-1,3,4-oxadiazole, 2,5-bis(1-naphthyl)-1,3,4-oxadiazole, 1,4-bis[2-(5-phenyloxadiazolyl)]benzene, 1,4-bis[2-(5-phenyloxadiazolyl)-4-tert-butylbenzene], 2-(4'-tert -butylphenyl) -5-(4"-biphenyl)-1,3,4-thiadiazole, 2,5-bis(1-naphthyl)-1,3,4-thiadiazole, 1,4-bis[2-(5-phenylthiadiazolyl) ]benzene, 2-(4'-tertbutylphenyl)-5-(4"-biphenyl)-1,3,4-triazole, 2,5-bis(1-naphthyl)-1,3,4-triazole, and 1,4-bis[2-(5-phenyltriazolyl)]benzene.

In the organic EL device of the present invention, the light-emitting layer may contain, in addition to the compound represented by any of formulas (I) to (IV), at least one species selected from among a light-emitting material, a doping material, a hole-injecting material, and an electron-injecting material. In order to enhance stability of the organic EL device fabricated according to the present invention, with respect to temperature, humidity, atmosphere, and other conditions, the surface of the device may be coated with a protective layer. Alternatively, the entirety of the device may be protected with silicone oil, resin, or a similar material.

The anode included in the organic EL device of the present invention is preferably formed of a conductive material having a work function higher than 4 eV. Examples of the conductive material include carbon, aluminum, vanadium, iron, cobalt, nickel, tungsten, silver, gold, platinum, palladium, alloys thereof, metal oxides such as tin oxide and indium oxide used in an ITO substrate or an NESA substrate, and organic conductive resins such as polythiophene and polypyrrole. The cathode included in the organic EL device of the present invention is preferably formed of a conductive material having a work function lower than 4 eV. No particular limitation is imposed on the conductive material, and examples include magnesium, calcium, tin, lead, titanium, yttrium, lithium, ruthenium, manganese, aluminum, lithium fluoride, and alloys thereof. No particular limitation is imposed on the type of alloys, and typical examples of the alloys include magnesium/silver, magnesium/indium, and lithium/aluminum. The alloy composition is appropriately regulated in accordance with temperature of vapor-deposition sources, atmosphere, vacuum degree, or other factors. In accordance with needs, each of the anode and the cathode may be composed of two or more layers.

In order to effectively emit light from the organic EL device, at least one surface of the device is preferably transparent sufficiently in a wavelength region of the emitted light. Preferably, the substrate is also transparent. Such a transparent electrode is produced from the aforementioned conductive material through vapor deposition, sputtering, or a similar method, such that a predetermined transparency is ensured. The light-emission surface of the electrode preferably has a light-transmittance of 10% or more. No particular limitation is imposed on the material of the substrate so long as the substrate has suitable mechanical and thermal strength and transparency. Example of the substrate material include a glass substrate and transparent resin film. Specific examples of the transparent resin film include polyethylene, ethylene-vinyl acetate copolymer, ethylene-vinyl alcohol copolymer, polypropylene, polystyrene, poly(methyl methacrylate), poly(vinyl chloride), poly(vinyl alcohol), polyvinyl butyral), nylon, polyether-ether-ketones, polysulfones, polyether sulfones, tetrafluoroethylene-perfluoroalkyl vinyl ether copolymer, poly(vinyl fluoride), tetrafluoroethylene-ethylene copolymer, tetrafluoroethylene-hexafluoropropylene copolymer, poly(chlorotrifluoroethylene), poly(vinylidene fluoride), polyesters, polycarbonates, polyurethanes, polyimides, polyether imides, polyimides, and polypropylene.

Each component layer of the organic EL device of the present invention may be formed through any of the dry film forming methods such as vacuum vapor deposition, sputtering, and plasma-ion-plating and the wet film formation methods such as spin-coating, dipping, and flow coating. Although no particular limitation is imposed on the film thickness, the film thickness must be controlled appropriately. When the thickness excessively large, a large voltage must be applied so as to gain a predetermined light output, thereby lowering efficiency, whereas when the thickness is too small, pinholes and other defects generate. In this case, sufficient emission luminance cannot be attained even though electric field is applied. In general, the thickness is preferably 5 nm to 10 μm, more preferably 10 nm to 0.2 μm.

In the case where the wet film formation method is employed, materials for forming each layer is dissolved or dispersed in an appropriate solvent such as ethanol, chloroform, tetrahydrofuran, or dioxane, and a thin film is formed from the solution or dispersion. Any appropriate solvents may be used. In order to enhance film formability and prevent pinhole generation in the film, an appropriate resin or additive may be incorporated into any of the organic thin film layers. Examples of employable resins include insulating resins such as polystyrene, polycarbonate, polyarylate, polyester, polyamide, polyurethane, polysulfone, poly(methyl methacrylate), poly(methyl acrylate), and cellulose; copolymers thereof; photoconducting resins such as poly-N-vinylcarbazole and polysilane; and conductive resins such as polythiophene and polypyrrole. Examples of the additives include an anti-oxidant, a UV-absorber, and a plasticizer.

As described above, by producing organic thin-film layers in the organic EL device from the organic EL device material of the present invention, the produced EL device exhibits a long service life and can emit blue light of high color purity at high emission efficiency.

The organic EL device of the present invention can be used as a flat light-emitting device for use in a flat-panel display of a wall-mounted, flat-panel television set; light sources for a copying machine, a printer, a backside light of a liquid-crystal display, indicators, etc.; display panels; signal lamps; etc., in addition to organic EL devices, the material of the present invention can be also used in an electrophotographic sensitizer, a photoelectric conversion device, a solar cell, an image sensor, etc.

The present invention will next be described in more detail by of examples, which should not be construed as limiting the invention thereto.

SYNTHESIS EXAMPLE 1

Synthesis of Compound (1)

Under argon flow, 6,12-dibromochrysene (3.8 g, 10 mmol), N-phenyl-2-naphthylamine (5.4 g, 25 mmol), palladium acetate (0.03 g, 1.5 mol %), tri-t-butylphosphine (0.06 g, 3 mol %), t-butoxysodium (2.4 g, 25 mmol), and anhydrous toluene (100 mL) were added to a 300-mL three-neck flask equipped with a condenser, and the mixture was heated overnight at 100° C. with stirring. After completion of reaction, precipitated crystals were collected through filtration, followed by washing with toluene (50 mL) and methanol (100 mL), to thereby yield 6.4 g of a pale yellow powder. The powder was identified as compound (1) through an NMR spectrum (see FIG. 1) and an FD-MS (field desorption mass spectrum) (yield: 98%).

The NMR spectrum (solvent: $CDCl_3$) was obtained by means of a Fourier-transform NMR spectrometer (R-1900 (90 MHz), product of Hitachi, Ltd.).

SYNTHESIS EXAMPLE 2

Synthesis of Compound (2)

Figure 2:
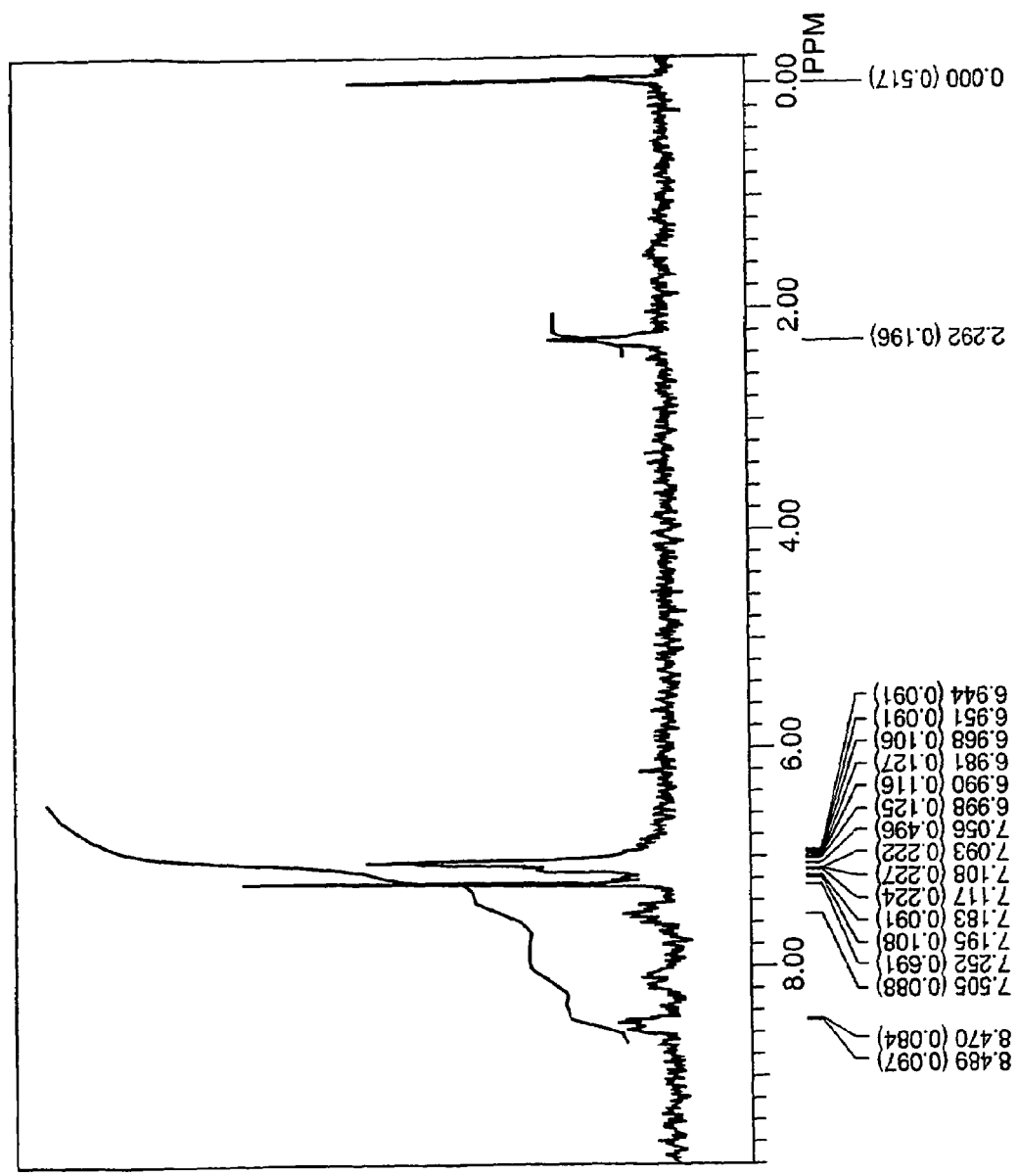
FIG. 2 is an NMR spectrum of compound (2) synthesized in Synthesis Example 2 and serving an organic EL device material according to the present invention.

Under argon flow, 6,12-dibromochrysene (3.8 g, 10 mmol), 4-methyldiphenylamine (4.5 g, 25 mmol), palladium acetate (0.03 g, 1.5 mol %), tri-t-butylphosphine (0.06 g, 3 mol %), t-butoxysodium (2.4 g, 25 mmol), and anhydrous toluene (100 mL) were added to a 300-mL three-neck flask equipped with a condenser, and the mixture was heated overnight at 100° C. with stirring. After completion of reaction, precipitated crystals were collected through filtration, followed by washing with toluene (50 mL) and methanol (100 mL), to thereby yield 5.4 g of a pale yellow powder. The powder was identified as compound (2) through an NMR spectrum (see FIG. 2) and an FD-MS (yield: 92%). The NMR spectrum was obtained under the same conditions as employed in Synthesis Example 1.

SYNTHESIS EXAMPLE 3

Synthesis of Compound (5)

Figure 3:
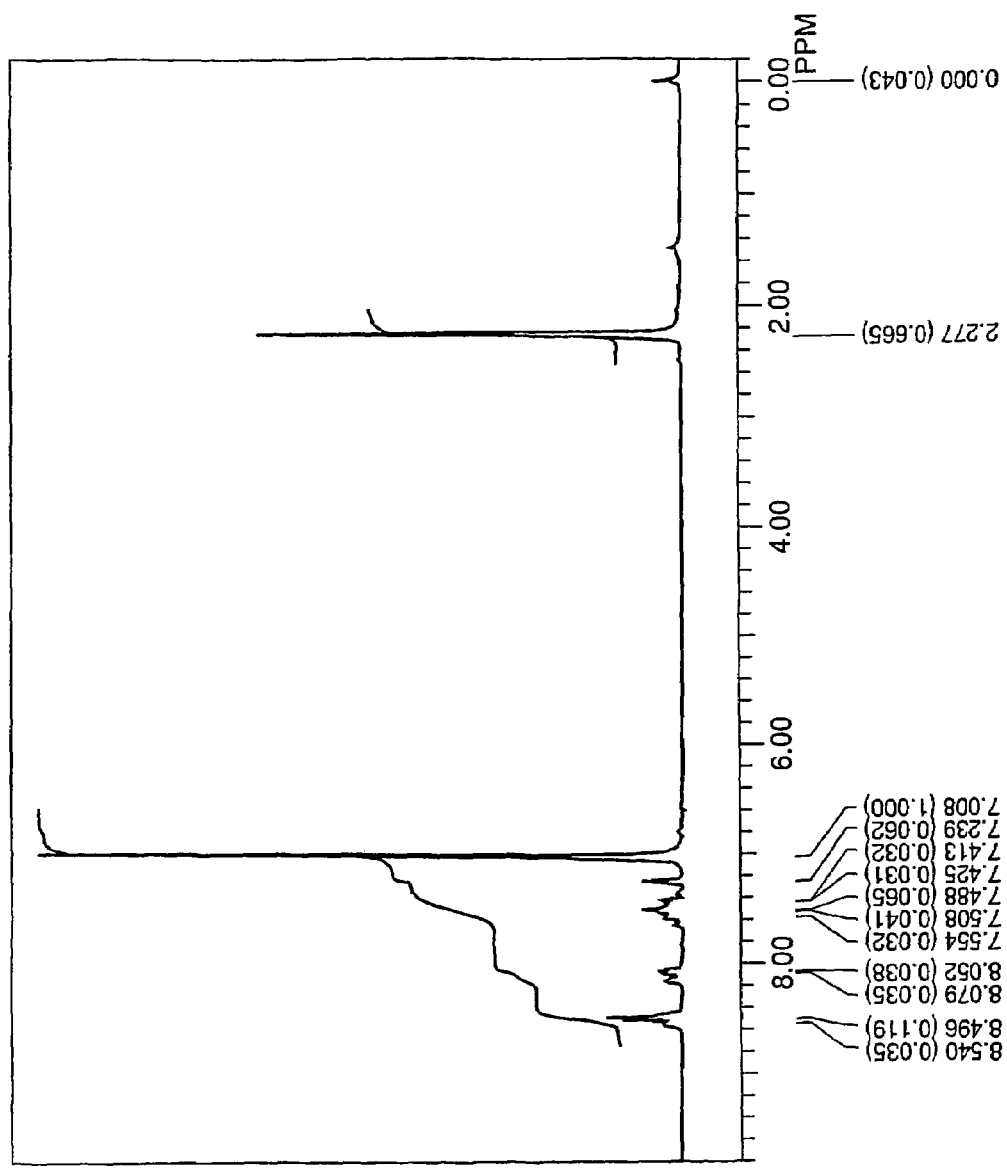
FIG. 3 is an NMR spectrum of compound (5) synthesized in Synthesis Example 3 and serving an organic EL device material according to the present invention.

Under argon flow, 6,12-dibromochrysene (3.8 g, 10 mmol), p,p'-ditolylamine (4.9 g, 25 mmol), palladium acetate (0.03 g, 1.5 mol %), tri-t-butylphosphine (0.06 g, 3 mol %), t-butoxysodium (2.4 g, 25 mmol), and anhydrous toluene (100 mL) were added to a 300-mL three-neck flask equipped with a condenser, and the mixture was heated overnight at 100° C. with stirring. After completion of reaction, precipitated crystals were collected through filtration, followed by washing with toluene (50 mL) and methanol (100 mL), to thereby yield 5.7 g of a pale yellow powder. The powder was identified as compound (5) through an NMR spectrum (see FIG. 3) and an FD-MS (yield: 93%). The NMR spectrum was obtained under the same conditions as employed in Synthesis Example 1.

SYNTHESIS EXAMPLE 4

Synthesis of Compound (6)

Figure 4:
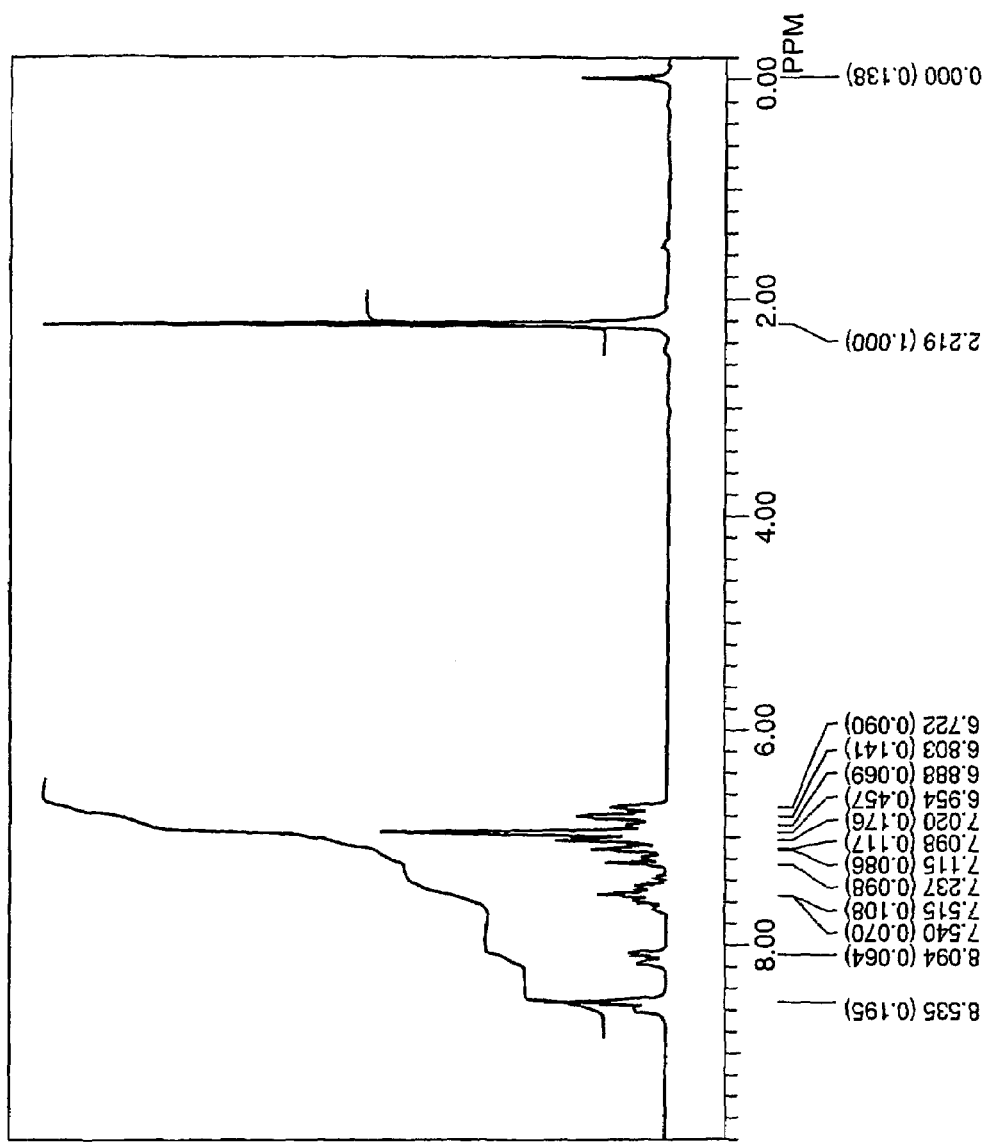
FIG. 4 is an NMR spectrum of compound (6) synthesized in Synthesis Example 4 and serving an organic EL device material according to the present invention.

Under argon flow, 6,12-dibromochrysene (3.8 g, 10 mmol), m,m'-ditolylamine (4.9 g, 25 mmol), palladium acetate (0.03 g, 1.5 mol %), tri-t-butylphosphine (0.06 g, 3 mol %), t-butoxysodium (2.4 g, 25 mmol), and anhydrous toluene (100 mL) were added to a 300-mL three-neck flask equipped with a condenser, and the mixture was heated overnight at 100° C. with stirring. After completion of reaction, precipitated crystals were collected through filtration, followed by washing with toluene (50 mL) and methanol (100 mL), to thereby yield 5.5 g of a pale yellow powder. The powder was identified as compound (6) through an NMR spectrum (see FIG. 4) and an FD-MS (yield: 89%). The NMR spectrum was obtained under the same conditions as employed in Synthesis Example 1.

SYNTHESIS EXAMPLE 5

Synthesis of Compound (8)

Figure 5:
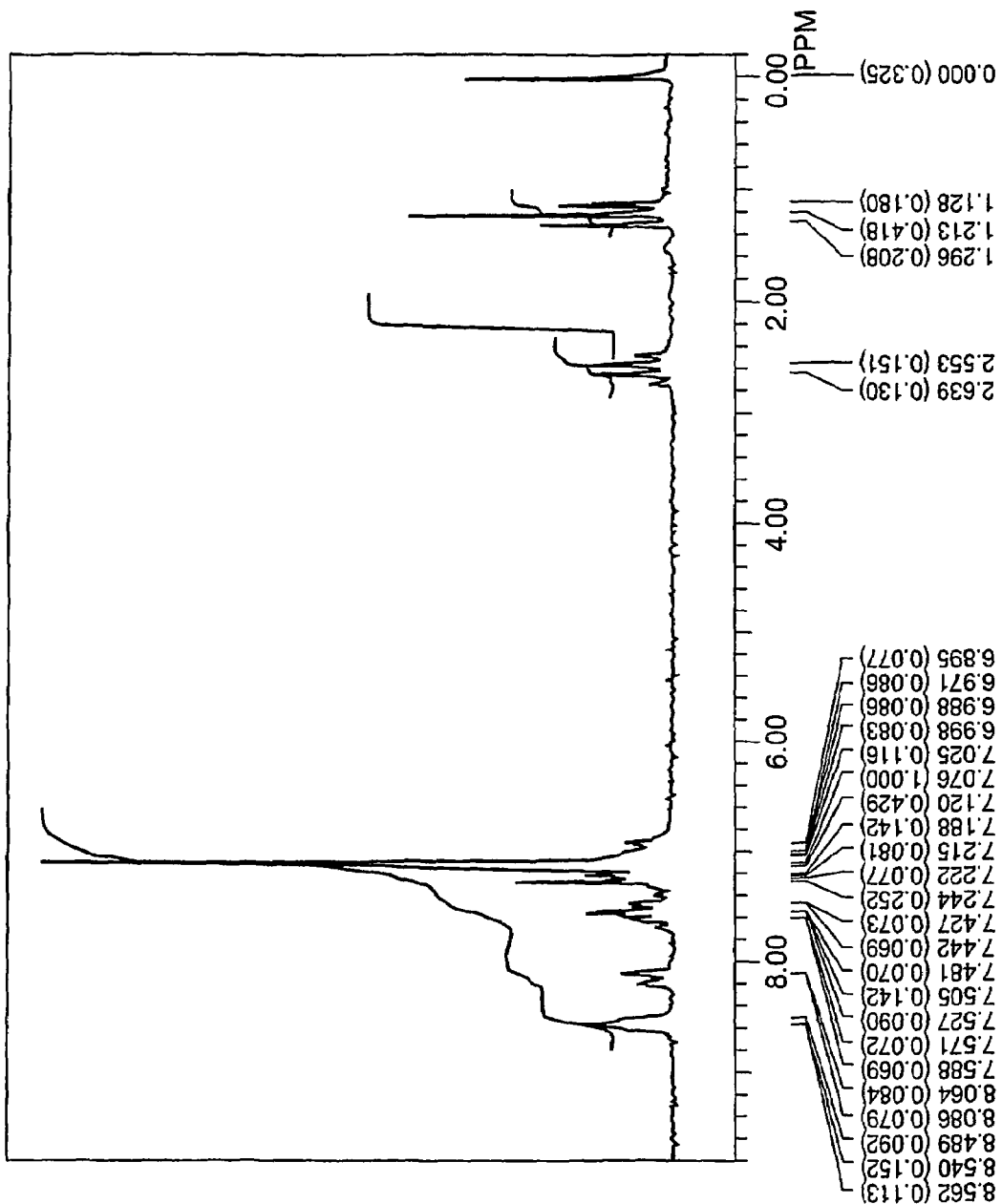
FIG. 5 is an NMR spectrum of compound (8) synthesized in Synthesis Example 5 and serving an organic EL device material according to the present invention.

Under argon flow, 6,12-dibromochrysene (3.8 g, 10 mmol), 4-ethyldiphenylamine (4.9 g, 25 mmol), palladium acetate (0.03 g, 1.5 mol %), tri-t-butylphosphine (0.06 g, 3 mol %), t-butoxysodium (2.4 g, 25 mmol), and anhydrous toluene (100 mL) were added to a 300-mL three-neck flask equipped with a condenser, and the mixture was heated overnight at 100° C. with stirring. After completion of reaction, precipitated crystals were collected through filtration, followed by washing with toluene (50 mL) and methanol (100 mL), to thereby yield 5.7 g of a pale yellow powder. The powder was identified as compound (8) through an NMR spectrum (see FIG. 5) and an FD-MS (yield: 92%). The NMR spectrum was obtained under the same conditions as employed in Synthesis Example 1.

SYNTHESIS EXAMPLE 6

Synthesis of Compound (9)

Figure 6:
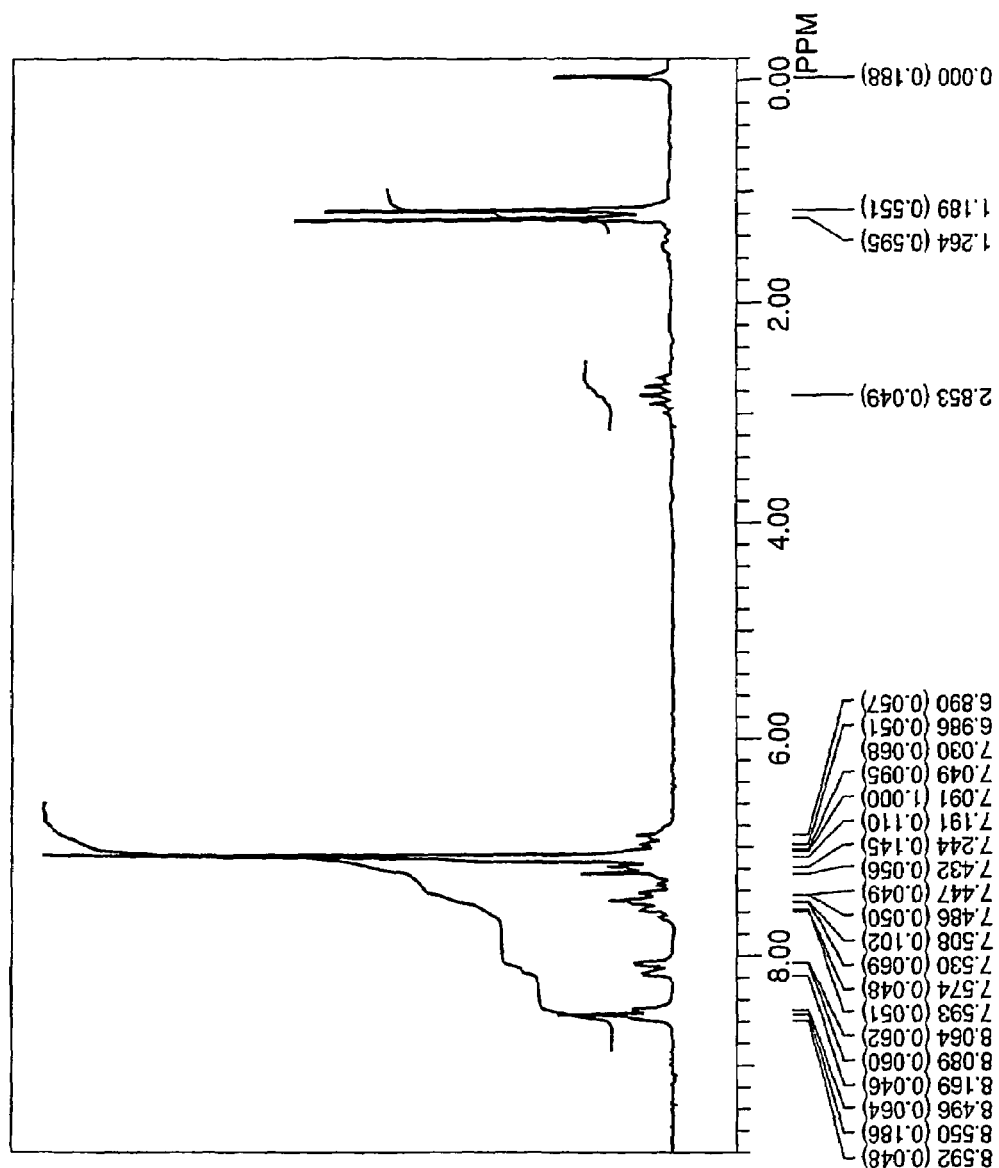
FIG. 6 is an NMR spectrum of compound (9) synthesized in Synthesis Example 6 and serving an organic EL device material according to the present invention.

Under argon flow, 6,12-dibromochrysene (3.8 g, 10 mmol), 4-isopropyldiphenylamine (5.2 g, 25 mmol), palladium acetate (0.03 g, 1.5 mol %), tri-t-butylphosphine (0.06 g, 3 mol %), t-butoxysodium (2.4 g, 25 mmol), and anhydrous toluene (100 mL) were added to a 300-mL three-neck flask equipped with a condenser, and the mixture was heated overnight at 100° C. with stirring. After completion of reaction, precipitated crystals were collected through filtration, followed by washing with toluene (50 mL) and methanol (100 mL), to thereby yield 6.3 g of a pale yellow powder. The powder was identified as compound (9) through an NMR spectrum (see FIG. 6) and an FD-MS (yield: 98%). The NMR spectrum was obtained under the same conditions as employed in Synthesis Example 1.

SYNTHESIS EXAMPLE 7

Synthesis of Compound (10)

Figure 7:
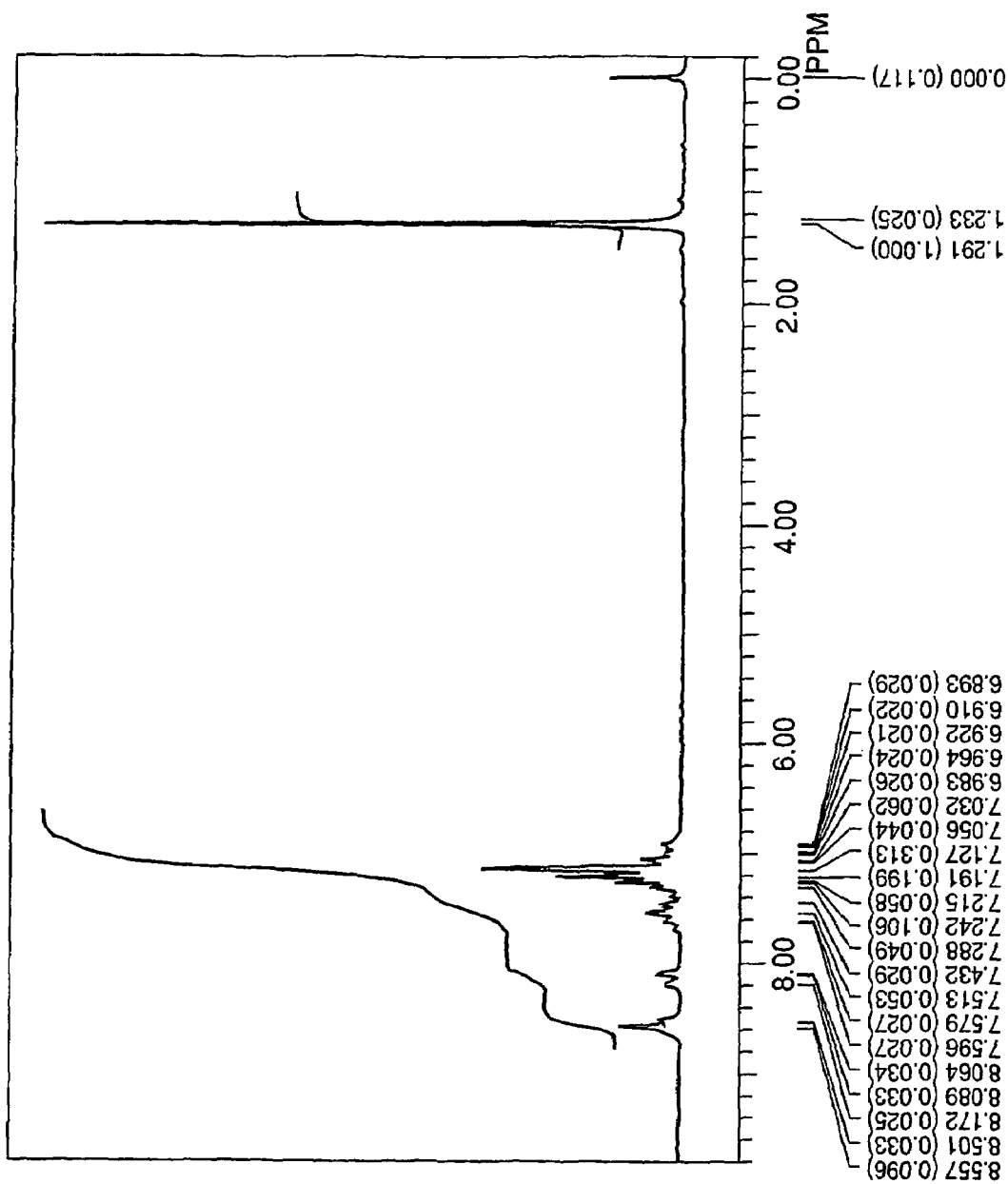
FIG. 7 is an NMR spectrum of compound (10) synthesized in Synthesis Example 7 and serving an organic EL device material according to the present invention.

Under argon flow, 6,12-dibromochrysene (3.8 g, 10 mmol), 4-t-butyldiphenylamine (5.6 g, 25 mmol), palladium acetate (0.03 g, 1.5 mol %), tri-t-butylphosphine (0.06 g, 3 mol %), t-butoxysodium (2.4 g, 25 mmol), and anhydrous toluene (100 mL) were added to a 300-mL three-neck flask equipped with a condenser, and the mixture was heated overnight at 100° C. with stirring. After completion of reaction, precipitated crystals were collected through filtration, followed by washing with toluene (50 mL) and methanol (100 mL), to thereby yield 5.3 g of a pale yellow powder. The powder was identified as compound (10) through an NMR spectrum (see FIG. 7) and an FD-MS (yield: 79%). The NMR spectrum was obtained under the same conditions as employed in Synthesis Example 1.

SYNTHESIS EXAMPLE 8

Synthesis of Compound (11)

Figure 8:
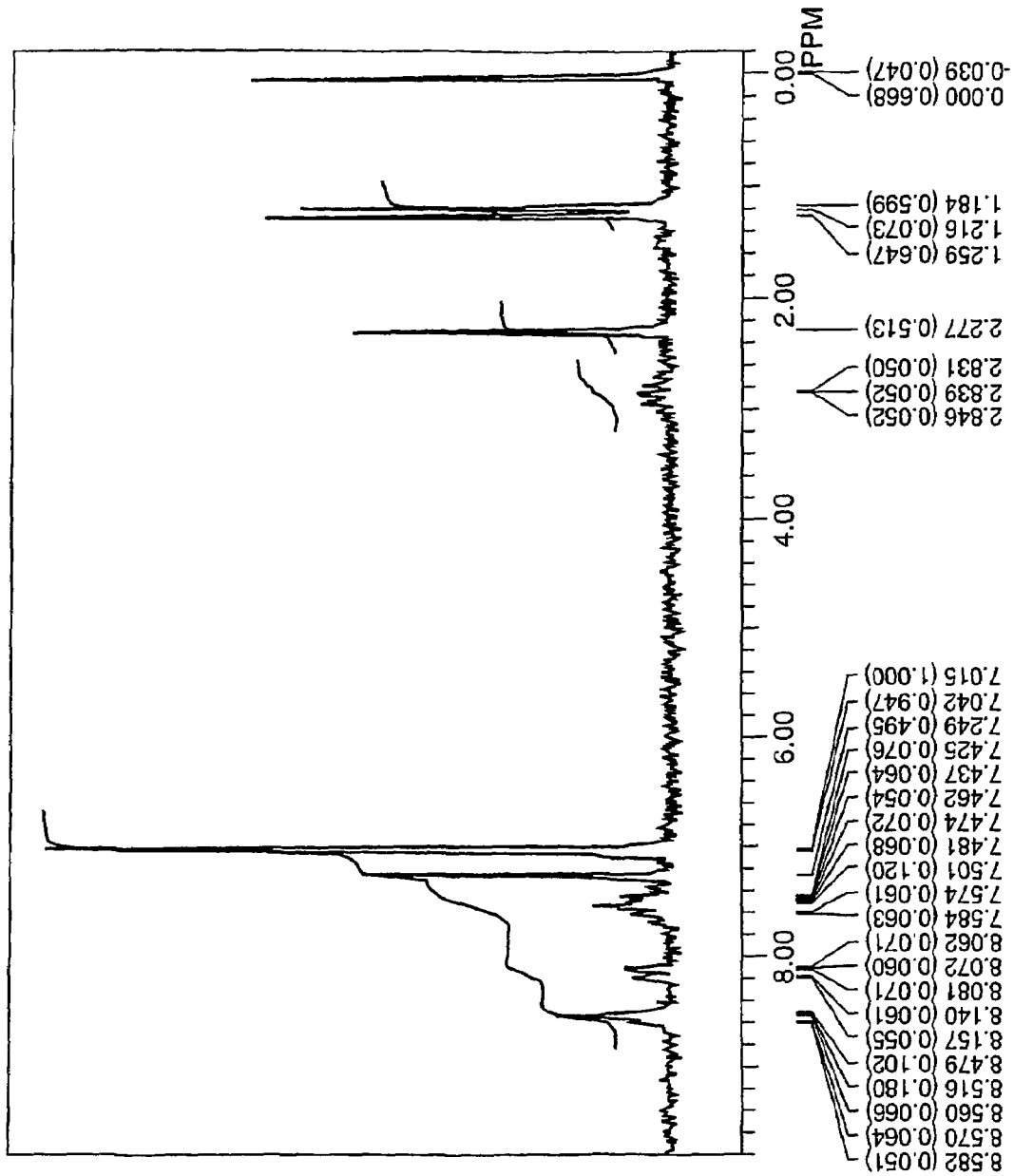
FIG. 8 is an NMR spectrum of compound (11) synthesized in Synthesis Example 8 and serving an organic EL device material according to the present invention.

Under argon flow, 6,12-dibromochrysene (3.8 g, 10 mmol), 4-isopropylphenyl-p-tolylamine (5.6 g, 25 mmol), palladium acetate (0.03 g, 1.5 mol %), tri-t-butylphosphine (0.06 g, 3 mol %), t-butoxysodium (2.4 g, 25 mmol), and anhydrous toluene (100 mL) were added to a 300-mL three-neck flask equipped with a condenser, and the mixture was heated overnight at 100° C. with stirring. After completion of reaction, precipitated crystals were collected through filtration, followed by washing with toluene (50 mL) and methanol (100 mL), to thereby yield 6.0 g of a pale yellow powder. The powder was identified as compound (11) through an NMR spectrum (see FIG. 8) and an FD-MS (yield: 89%). The NMR spectrum was obtained under the same conditions as employed in Synthesis Example 1.

SYNTHESIS EXAMPLE 9

Synthesis of Compound (12)

Figure 9:
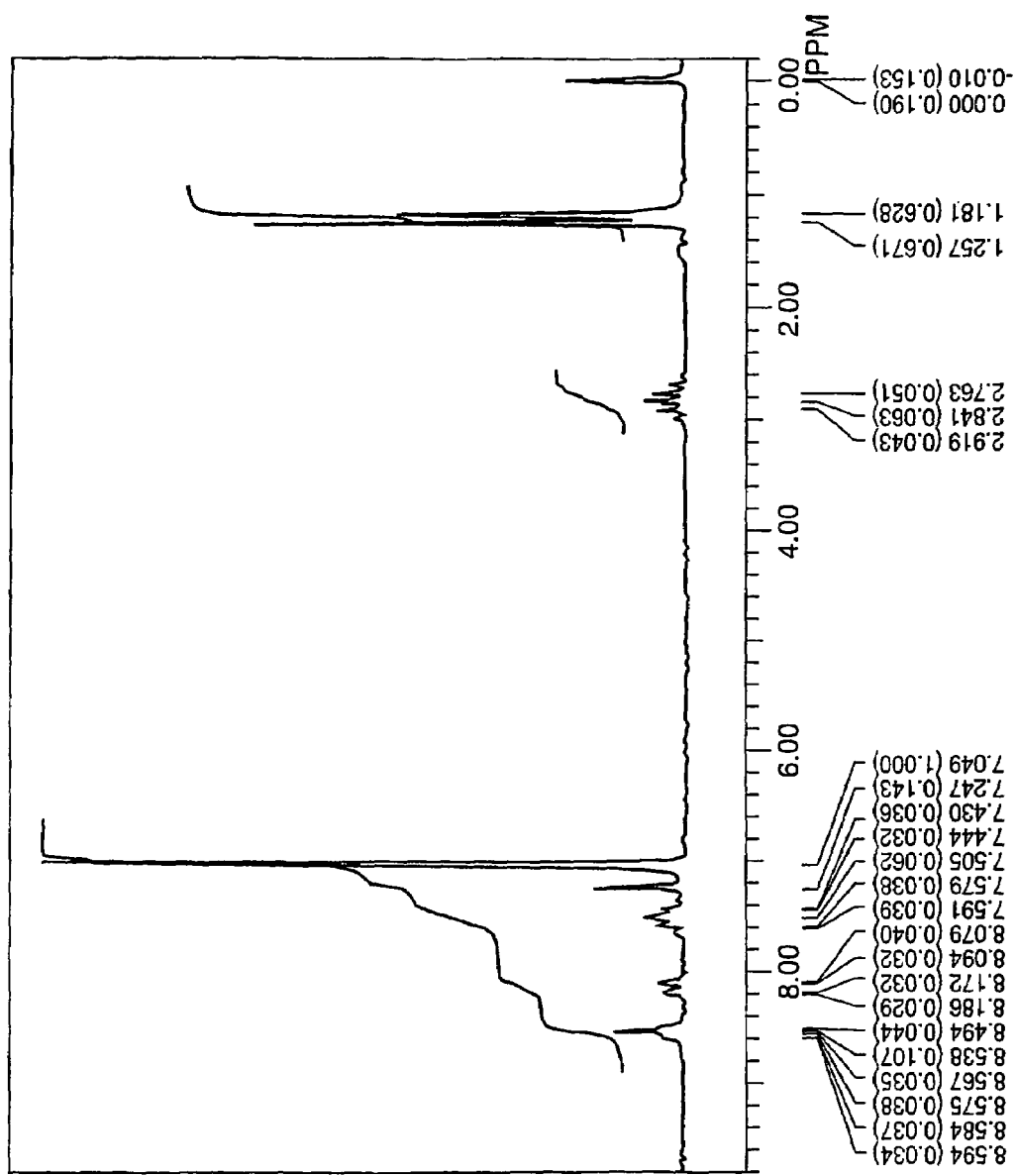
FIG. 9 is an NMR spectrum of compound (12) synthesized in Synthesis Example 9 and serving an organic EL device material according to the present invention.

Under argon flow, 6,12-dibromochrysene (3.8 g, 10 mmol), 4-diisopropylphenylamine (6.3 g, 25 mmol), palladium acetate (0.03 g, 1.5 mol %), tri-t-butylphosphine (0.06 g, 3 mol %), t-butoxysodium (2.4 g, 25 mmol), and anhydrous toluene (100 mL) were added to a 300-mL three-neck flask equipped with a condenser, and the mixture was heated overnight at 100° C. with stirring. After completion of reaction, precipitated crystals were collected through filtration, followed by washing with toluene (50 mL) and methanol (100 mL), to thereby yield 6.9 g of a pale yellow powder. The powder was identified as compound (12) through an NMR spectrum (see FIG. 9) and an FD-MS (yield: 95%). The NMR spectrum was obtained under the same conditions as employed in Synthesis Example 1.

SYNTHESIS EXAMPLE 10

Synthesis of Compound (14)

Figure 10:
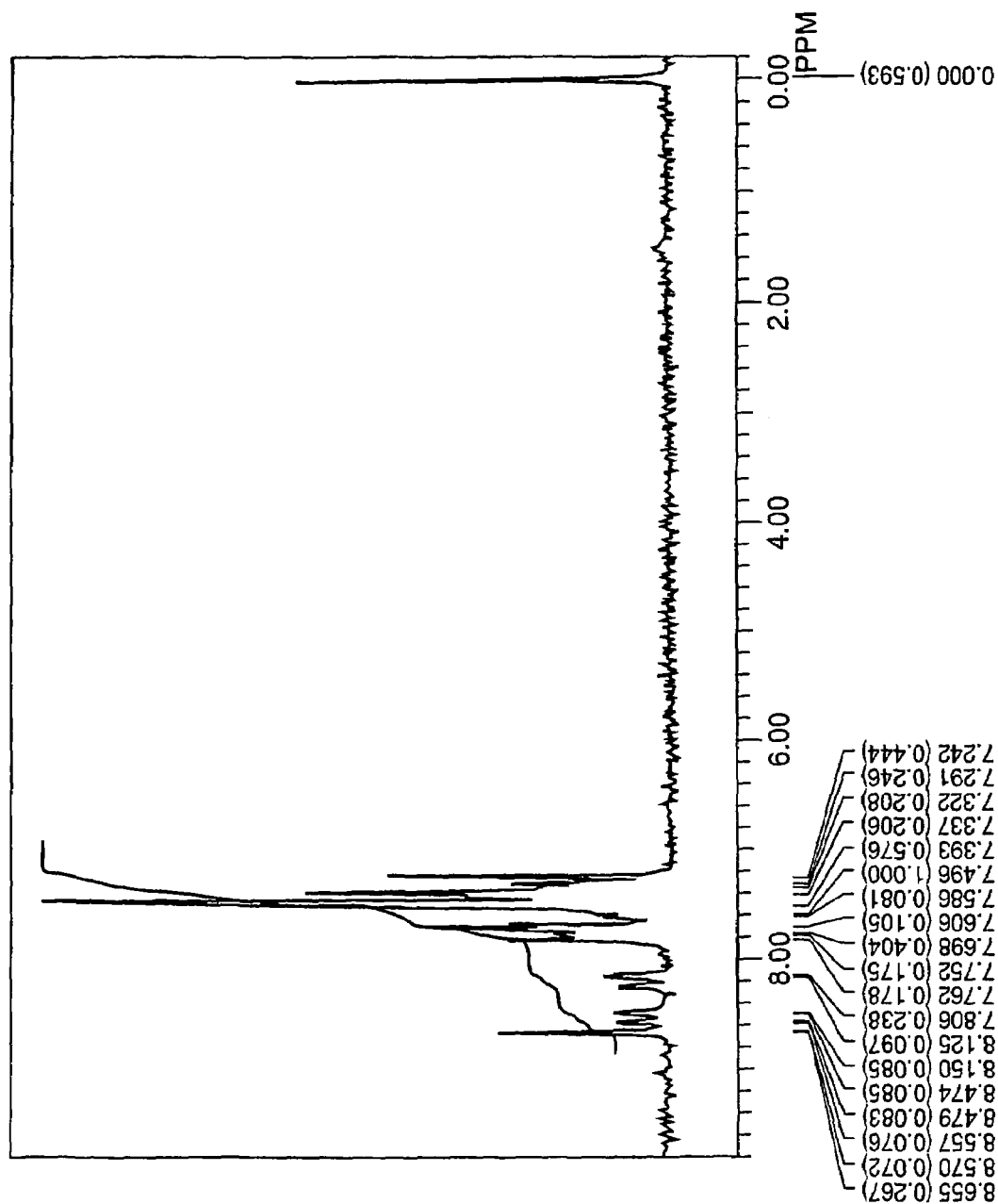
FIG. 10 is an NMR spectrum of compound (14) synthesized in Synthesis Example 10 and serving an organic EL device material according to the present invention.

Under argon flow, 6,12-dibromochrysene (3.8 g, 10 mmol), di-2-naphthylamine (6.7 g, 25 mmol), palladium acetate (0.03 g, 1.5 mol %), tri-t-butylphosphine (0.06 g, 3 mol %), t-butoxysodium (2.4 g, 25 mmol), and anhydrous toluene (100 mL) were added to a 300-mL three-neck flask equipped with a condenser, and the mixture was heated overnight at 100° C. with stirring. After completion of reaction, precipitated crystals were collected through filtration, followed by washing with toluene (50 mL) and methanol (100 mL), to thereby yield 7.2 g of a pale yellow powder. The powder was identified as compound (14) through an NMR spectrum (see FIG. 10) and an FD-MS (yield: 94%). The NMR spectrum was obtained under the same conditions as employed in Synthesis Example 1.

SYNTHESIS EXAMPLE 11

Synthesis of Compound (19)

Figure 11:
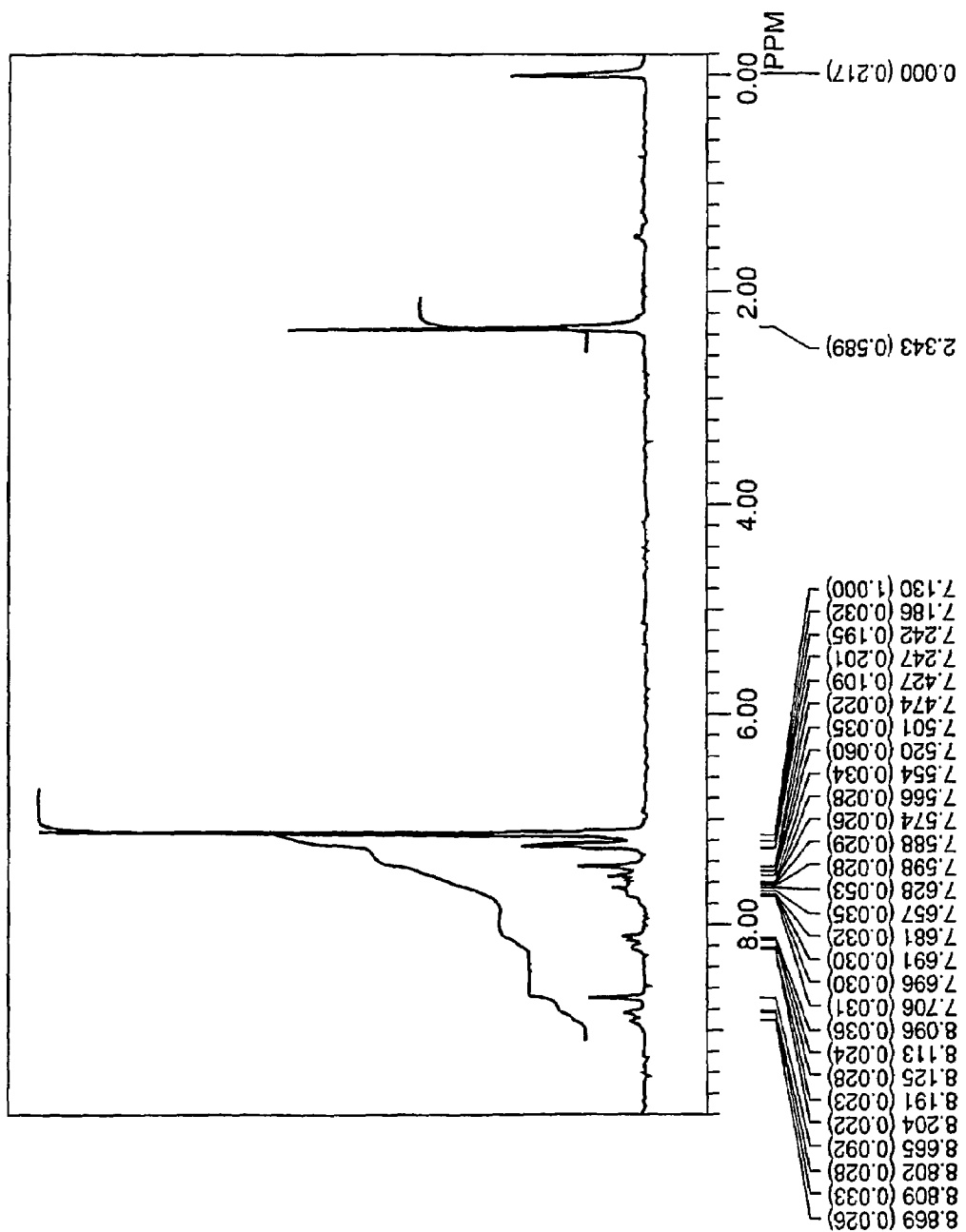
FIG. 11 is an NMR spectrum of compound (19) synthesized in Synthesis Example 11 and serving an organic EL device material according to the present invention.

Under argon flow, 6,12-dibromochrysene (3.8 g, 10 mmol), 4-(di-p-tolylamino)phenylboronic acid (7.9 g, 25 mmol), tetrakistriphenylphosphine palladium (0.17 g, 1.5 mol %), aqueous sodium carbonate (30 mL, 60 mmol, 2M), and toluene (60 mL) were added to a 300-mL three-neck flask equipped with a condenser, and the mixture was heated overnight at 100° C. with stirring. After completion of reaction, precipitated crystals were collected through filtration, followed by washing with toluene (50 mL) and methanol (100 mL), to thereby yield 7.3 g of a pale yellow powder. The powder was identified as compound (19) through an NMR spectrum (see FIG. 11) and an FD-MS (yield: 95%). The NMR spectrum was obtained under the same conditions as employed in Synthesis Example 1.

EXAMPLE 1

An indium tin oxide transparent electrode (thickness: 120 nm) was formed on a glass substrate (25×75×1.1 mm). The glass substrate was cleaned through irradiation with a UV ray in an ozone atmosphere, and placed in a vacuum deposition apparatus.

On the transparent electrode, N',N"-bis[4-(diphenylamino) phenyl]-N',N"-diphenylvinyl-4,4'-diamine serving as a hole-injecting layer (thickness: 60 nm), N,N,N',N'-tetrakis(4-biphenyl)-4,4'-benzidine serving as a hole-transporting layer (thickness: 20 nm) were sequentially vapor-deposited, followed by simultaneously vapor-depositing 10,10'-bis[1,1',4', 1"]terphenyl-2-yl-9,9'-bianthracenyl and the aforementioned compound (2) (40:2 by weight) thereon, to thereby form a light-emitting layer (thickness: 40 nm).

Subsequently, tris(8-hydroxyquinolinato)aluminum serving as an electron-injecting layer (thickness: 10 nm) was deposited, followed by sequentially vapor-depositing lithium fluoride (thickness: 1 nm) and aluminum (thickness: 150 nm). The lithium fluoride/aluminum film served as a cathode. Thus, an organic EL device was fabricated.

When the thus-fabricated organic EL device was tested under application of voltage, a blue-light emission with an emission luminance of 410 cd/m$^2$ (maximum peak emission wavelength: 457 nm) was observed at a voltage of 6 V and a current density of 10 mA/cm$^2$. When the EL device was continuously tested under voltage application (DC) at an initial luminance of 500 cd/m$^2$, the half-life time was found to be 2,160 hours.

EXAMPLE 2

The procedure of Example 1 was repeated, except that compound (5) was used instead of compound (2), to thereby fabricate an organic EL device.

When the thus-fabricated organic EL device was tested under application of voltage, a blue-light emission with an emission luminance of 596 cd/m$^2$ (maximum peak emission wavelength: 463 nm) was observed at a voltage of 6.5 V and a current density of 10 mA/cm$^2$. When the EL device was continuously tested under voltage application in a manner similar to that of Example 1, the half-life time was found to be 3,880 hours.

EXAMPLE 3

The procedure of Example 1 was repeated, except that compound (11) was used instead of compound (2), to thereby fabricate an organic EL device.

When the thus-fabricated organic EL device was tested under application of voltage, a blue-light emission with an emission luminance of 594 cd/m$^2$ (maximum peak emission wavelength: 462 nm) was observed at a voltage of 6.3 V and a current density of 10 mA/cm$^2$. When the EL device was continuously tested under voltage application in a manner similar to that of Example 1, the half-life time was found to be 4,590 hours.

COMPARATIVE EXAMPLE 1

The procedure of Example 1 was repeated, except that 6,12-bis(diphenylamino)chrysene was used instead of compound (2), to thereby fabricate an organic EL device.

When the thus-fabricated organic EL device was tested under application of voltage, a blue-light emission with an emission luminance of 311 cd/m$^2$ (maximum peak emission wavelength: 451 nm) was observed at a voltage of 6.2 V and a current density of 10 mA/cm$^2$. When the EL device was continuously tested under voltage application in a manner similar to that of Example 1, the half-life time was found to be as short as 1,000 hours.

Industrial Applicability

The organic EL device including the organic EL device material of the present invention serving as a light-emitting material attains emission luminance sufficient for use in practice through low applied voltage. The device also attains high emission efficiency and has a long service life; i.e., does not severely deteriorated during use for a long period of time.

The invention claimed is:
1. An organic electroluminescent device material comprising an aromatic amine derivative represented by any of the following formulas (I) and (II):

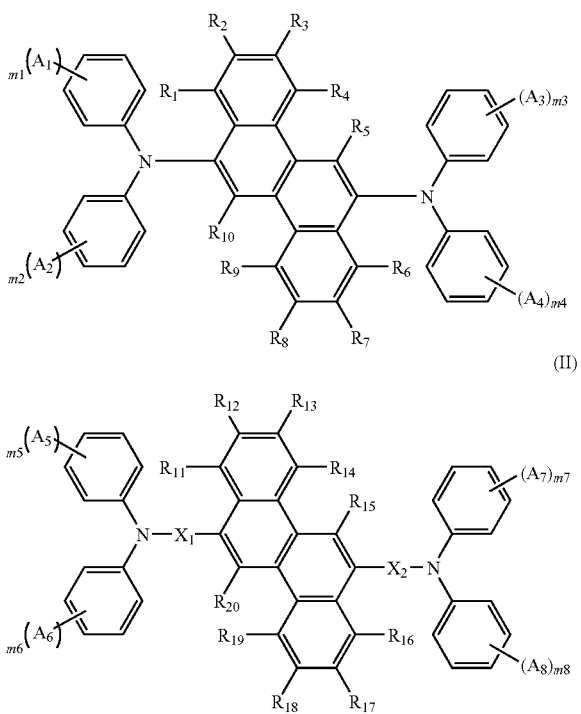

wherein each of $A_1$ to $A_8$ represents an alkyl group selected from the group consisting of methyl, ethyl, propyl, isopropyl, butyl, sec-butyl, tert-butyl, pentyl, hexyl, heptyl, octyl, stearyl, trichloromethyl, and trifluromethyl; a substituted or unsubstituted aryl group having 5 to 50 ring carbon atoms; an unsubstituted cycloalkyl group having 3 to 50 ring carbon atoms; an unsubstituted alkoxyl group having 1 to 50 carbon atoms; a substituted or unsubstituted arylamino group having 5 to 50 ring carbon atoms; a substituted or unsubstituted alkylamino group having 1 to 20 carbon atoms; or a halogen atom; each of m1 to m8 is independently an integer of 0 to 5, with the proviso that at least one of m1, m2, m3, and m4 is 1 or greater, and at least one of m5, m6, m7, and m8 is 1 or greater, and when any one of m1, m2, m3, m4, m5, m6, m7, and m8 is 2 or greater, groups represented by any of $A_1$ to $A_8$ may be identical to or different from one another, or may be linked together to form a saturated or unsaturated ring;

each of $R_1$ to $R_{20}$ represents a hydrogen atom, a substituted or unsubstituted alkyl group having 1 to 20 carbon atoms, a substituted or unsubstituted aryl group having 6 to 20 ring carbon atoms, or a cyano group; and each of $X_1$ and $X_2$ represents a substituted or unsubstituted arylene group having 6 to 20 ring carbon atoms.

2. An organic electroluminescent device material as described in claim 1, which is a light-emitting material for use in an organic electroluminescent device.

3. An organic electroluminescent device comprising a cathode, an anode, and one or more organic thin-film layers interposed between the cathode and the anode, the organic thin-layers including at least a light-emitting layer, wherein at least one of the organic thin-film layers contains the organic electroluminescent device material as recited in claim 1 in the form of single component material or a mixture of a plurality of components.

4. An organic electroluminescent device comprising a cathode, an anode, and one or more organic thin-film layers interposed between the cathode and the anode, the organic thin-layers including at least a light-emitting layer, wherein the light-emitting layer contains the organic electroluminescent device material as recited in claim 1 in an amount of 0.1 to 20 wt. %.

5. An organic electroluminescent device as described in claim 3, which further includes a layer containing an aromatic tertiary amine derivative and/or a phthalocyanine derivative, the layer being provided between the light-emitting layer and the anode.

6. An organic electroluminescent device as described in claim 4, which further includes a layer containing an aromatic tertiary amine derivative and/or a phthalocyanine derivative, the layer being provided between the light-emitting layer and the anode.

7. An organic electroluminescent device comprising the organic electroluminescent device material as described in claim 1, wherein the organic electroluminescent device emits blue light.

* * * * *